(12) United States Patent
Gally et al.

(10) Patent No.: US 7,623,752 B2
(45) Date of Patent: *Nov. 24, 2009

(54) SYSTEM AND METHOD OF TESTING HUMIDITY IN A SEALED MEMS DEVICE

(75) Inventors: Brian J. Gally, Los Gatos, CA (US); Lauren Palmateer, San Francisco, CA (US); Manish Kothari, Cupertino, CA (US); William J. Cummings, Millbrae, CA (US)

(73) Assignee: IDC, LLC, San Francisco, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/021,196

(22) Filed: Jan. 28, 2008

(65) Prior Publication Data

US 2008/0115569 A1 May 22, 2008

Related U.S. Application Data

(63) Continuation of application No. 11/173,822, filed on Jul. 1, 2005, now Pat. No. 7,343,080.

(60) Provisional application No. 60/613,567, filed on Sep. 27, 2004.

(51) Int. Cl.
*G02B 6/00* (2006.01)

(52) U.S. Cl. .................................................. 385/147

(58) Field of Classification Search ........................ None
See application file for complete search history.

(56) References Cited

U.S. PATENT DOCUMENTS

| 2,534,846 A | 12/1950 | Ambrose et al. |
| 3,416,359 A | 12/1968 | Durbin et al. |
| 3,439,973 A | 4/1969 | Paul et al. |
| 3,443,854 A | 5/1969 | Weiss |
| 3,653,741 A | 4/1972 | Marks |

(Continued)

FOREIGN PATENT DOCUMENTS

CH 685887 A5 10/1995

(Continued)

OTHER PUBLICATIONS

Akasaka, "Three-Dimensional IC Trends," Proceedings of IEEE, vol. 74, No. 12, pp. 1703-1714 (Dec. 1986).

(Continued)

*Primary Examiner*—Sung H Pak
(74) *Attorney, Agent, or Firm*—Knobbe Martens Olson & Bear, LLP

(57) ABSTRACT

One embodiment provides a method of testing humidity, comprising: i) determining a property of a device which encloses a plurality of interferometric modulators and ii) determining a relative humidity value or a degree of the relative humidity inside the device based at least in part upon the determined property, wherein the determined property comprises at least one of i) the thickness and width of a seal of the device and ii) adhesive permeability of a component of the device. In one embodiment, the determined property further comprises at least one of the following: i) temperature-humidity combination inside the device, ii) a desiccant capacity inside the device and iii) a device size.

18 Claims, 13 Drawing Sheets

U.S. PATENT DOCUMENTS

| | | | |
|---|---|---|---|
| 3,656,836 A | 4/1972 | de Cremoux et al. | |
| 3,672,207 A | 6/1972 | Cramp et al. | |
| 3,813,265 A | 5/1974 | Marks | |
| 3,899,295 A | 8/1975 | Halpern et al. | |
| 3,915,573 A | 10/1975 | Knoll et al. | |
| 3,955,880 A | 5/1976 | Lierke | |
| 3,956,880 A | 5/1976 | Young et al. | |
| 4,001,808 A | 1/1977 | Ebihara et al. | |
| 4,099,854 A | 7/1978 | Decker et al. | |
| 4,158,960 A | 6/1979 | White et al. | |
| 4,224,565 A | 9/1980 | Sosniak et al. | |
| 4,228,437 A | 10/1980 | Shelton | |
| 4,377,324 A | 3/1983 | Durand et al. | |
| 4,389,096 A | 6/1983 | Hori et al. | |
| 4,403,248 A | 9/1983 | te Velde | |
| 4,441,791 A | 4/1984 | Hornbeck | |
| 4,445,050 A | 4/1984 | Marks | |
| 4,482,213 A | 11/1984 | Piliavin et al. | |
| 4,500,171 A | 2/1985 | Penz et al. | |
| 4,519,676 A | 5/1985 | te Velde | |
| 4,531,126 A | 7/1985 | Sadones | |
| 4,566,935 A | 1/1986 | Hornbeck | |
| 4,571,603 A | 2/1986 | Hornbeck et al. | |
| 4,596,992 A | 6/1986 | Hornbeck | |
| 4,615,595 A | 10/1986 | Hornbeck | |
| 4,646,914 A | 3/1987 | Gipson | |
| 4,662,746 A | 5/1987 | Hornbeck | |
| 4,663,083 A | 5/1987 | Marks | |
| 4,681,403 A | 7/1987 | te Velde et al. | |
| 4,710,732 A | 12/1987 | Hornbeck | |
| 4,748,366 A | 5/1988 | Taylor | |
| 4,786,128 A | 11/1988 | Birnbach | |
| 4,790,635 A | 12/1988 | Apsley | |
| 4,856,863 A | 8/1989 | Sampsell et al. | |
| 4,893,499 A | 1/1990 | Layton et al. | |
| 4,897,360 A | 1/1990 | Guckel et al. | |
| 4,954,789 A | 9/1990 | Sampsell | |
| 4,956,619 A | 9/1990 | Hornbeck | |
| 4,982,184 A | 1/1991 | Kirkwood | |
| 5,018,256 A | 5/1991 | Hornbeck | |
| 5,022,745 A | 6/1991 | Zayhowski et al. | |
| 5,028,939 A | 7/1991 | Hornbeck et al. | |
| 5,037,173 A | 8/1991 | Sampsell et al. | |
| 5,044,736 A | 9/1991 | Jaskie et al. | |
| 5,061,049 A | 10/1991 | Hornbeck | |
| 5,075,796 A | 12/1991 | Schildkraut et al. | |
| 5,078,479 A | 1/1992 | Vuilleumier | |
| 5,079,544 A | 1/1992 | DeMond et al. | |
| 5,083,857 A | 1/1992 | Hornbeck | |
| 5,096,279 A | 3/1992 | Hornbeck et al. | |
| 5,099,353 A | 3/1992 | Hornbeck | |
| 5,124,834 A | 6/1992 | Cusano et al. | |
| 5,142,405 A | 8/1992 | Hornbeck | |
| 5,153,771 A | 10/1992 | Link et al. | |
| 5,162,787 A | 11/1992 | Thompson et al. | |
| 5,168,406 A | 12/1992 | Nelson | |
| 5,170,156 A | 12/1992 | DeMond et al. | |
| 5,172,262 A | 12/1992 | Hornbeck | |
| 5,175,772 A | 12/1992 | Kahn et al. | |
| 5,179,274 A | 1/1993 | Sampsell | |
| 5,192,395 A | 3/1993 | Boysel et al. | |
| 5,192,946 A | 3/1993 | Thompson et al. | |
| 5,206,629 A | 4/1993 | DeMond et al. | |
| 5,214,419 A | 5/1993 | DeMond et al. | |
| 5,214,420 A | 5/1993 | Thompson et al. | |
| 5,216,537 A | 6/1993 | Hornbeck | |
| 5,226,099 A | 7/1993 | Mignardi et al. | |
| 5,231,532 A | 7/1993 | Magel et al. | |
| 5,233,385 A | 8/1993 | Sampsell | |
| 5,233,456 A | 8/1993 | Nelson | |
| 5,233,459 A | 8/1993 | Bozler et al. | |
| 5,254,980 A | 10/1993 | Hendrix et al. | |
| 5,272,473 A | 12/1993 | Thompson et al. | |
| 5,278,652 A | 1/1994 | Urbanus et al. | |
| 5,280,277 A | 1/1994 | Hornbeck | |
| 5,287,096 A | 2/1994 | Thompson et al. | |
| 5,296,950 A | 3/1994 | Lin et al. | |
| 5,305,640 A | 4/1994 | Boysel et al. | |
| 5,307,139 A | 4/1994 | Tyson, II et al. | |
| 5,311,360 A | 5/1994 | Bloom et al. | |
| 5,312,513 A | 5/1994 | Florence et al. | |
| 5,323,002 A | 6/1994 | Sampsell et al. | |
| 5,325,116 A | 6/1994 | Sampsell | |
| 5,327,286 A | 7/1994 | Sampsell et al. | |
| 5,331,454 A | 7/1994 | Hornbeck | |
| 5,339,116 A | 8/1994 | Urbanus et al. | |
| 5,365,283 A | 11/1994 | Doherty et al. | |
| 5,381,253 A | 1/1995 | Sharp et al. | |
| 5,401,983 A | 3/1995 | Jokerst et al. | |
| 5,411,769 A | 5/1995 | Hornbeck | |
| 5,444,566 A | 8/1995 | Gale et al. | |
| 5,446,479 A | 8/1995 | Thompson et al. | |
| 5,448,314 A | 9/1995 | Heimbuch et al. | |
| 5,452,024 A | 9/1995 | Sampsell | |
| 5,454,906 A | 10/1995 | Baker et al. | |
| 5,457,493 A | 10/1995 | Leddy et al. | |
| 5,457,566 A | 10/1995 | Sampsell et al. | |
| 5,459,409 A | 10/1995 | Henley et al. | |
| 5,459,602 A | 10/1995 | Sampsell | |
| 5,459,610 A | 10/1995 | Bloom et al. | |
| 5,461,411 A | 10/1995 | Florence et al. | |
| 5,489,952 A | 2/1996 | Gove et al. | |
| 5,497,172 A | 3/1996 | Doherty et al. | |
| 5,497,197 A | 3/1996 | Gove et al. | |
| 5,499,062 A | 3/1996 | Urbanus | |
| 5,500,635 A | 3/1996 | Mott | |
| 5,500,761 A | 3/1996 | Goossen et al. | |
| 5,506,597 A | 4/1996 | Thompson et al. | |
| 5,515,076 A | 5/1996 | Thompson et al. | |
| 5,517,347 A | 5/1996 | Sampsell | |
| 5,523,803 A | 6/1996 | Urbanus et al. | |
| 5,526,051 A | 6/1996 | Gove et al. | |
| 5,526,172 A | 6/1996 | Kanack | |
| 5,526,688 A | 6/1996 | Boysel et al. | |
| 5,535,047 A | 7/1996 | Hornbeck | |
| 5,548,301 A | 8/1996 | Kornher et al. | |
| 5,551,293 A | 9/1996 | Boysel et al. | |
| 5,552,924 A | 9/1996 | Tregilgas | |
| 5,559,358 A | 9/1996 | Burns et al. | |
| 5,563,398 A | 10/1996 | Sampsell | |
| 5,567,334 A | 10/1996 | Baker et al. | |
| 5,570,135 A | 10/1996 | Gove et al. | |
| 5,579,149 A | 11/1996 | Moret et al. | |
| 5,581,272 A | 12/1996 | Conner et al. | |
| 5,583,688 A | 12/1996 | Hornbeck | |
| 5,589,852 A | 12/1996 | Thompson et al. | |
| 5,597,736 A | 1/1997 | Sampsell | |
| 5,600,383 A | 2/1997 | Hornbeck | |
| 5,602,671 A | 2/1997 | Hornbeck | |
| 5,606,441 A | 2/1997 | Florence et al. | |
| 5,608,468 A | 3/1997 | Gove et al. | |
| 5,610,438 A | 3/1997 | Wallace et al. | |
| 5,610,624 A | 3/1997 | Bhuva | |
| 5,610,625 A | 3/1997 | Sampsell | |
| 5,619,059 A | 4/1997 | Li et al. | |
| 5,619,365 A | 4/1997 | Rhoades et al. | |
| 5,619,366 A | 4/1997 | Rhoads et al. | |
| 5,636,052 A | 6/1997 | Arney et al. | |
| 5,646,768 A | 7/1997 | Kaeiyama | |
| 5,650,881 A | 7/1997 | Hornbeck | |
| 5,654,741 A | 8/1997 | Sampsell et al. | |
| 5,657,099 A | 8/1997 | Doherty et al. | |
| 5,659,374 A | 8/1997 | Gale, Jr. et al. | |
| 5,665,997 A | 9/1997 | Weaver et al. | |

| | | | | | | |
|---|---|---|---|---|---|---|
| 5,703,710 | A | 12/1997 | Brinkman et al. | 6,778,155 B2 | 8/2004 | Doherty et al. |
| 5,710,656 | A | 1/1998 | Goossen | 6,794,119 B2 | 9/2004 | Miles |
| 5,729,245 | A | 3/1998 | Gove et al. | 6,811,267 B1 | 11/2004 | Allen et al. |
| 5,739,945 | A | 4/1998 | Tayebati | 6,819,469 B1 | 11/2004 | Koba |
| 5,745,193 | A | 4/1998 | Urbanus et al. | 6,822,628 B2 | 11/2004 | Dunphy et al. |
| 5,745,281 | A | 4/1998 | Yi et al. | 6,824,739 B1 | 11/2004 | Arney et al. |
| 5,771,116 | A | 6/1998 | Miller et al. | 6,829,132 B2 | 12/2004 | Martin et al. |
| 5,784,190 | A | 7/1998 | Worley | 6,853,129 B1 | 2/2005 | Cummings et al. |
| 5,784,212 | A | 7/1998 | Hornbeck | 6,855,610 B2 | 2/2005 | Tung et al. |
| 5,818,095 | A | 10/1998 | Sampsell | 6,859,218 B1 | 2/2005 | Luman et al. |
| 5,825,528 | A | 10/1998 | Goossen | 6,861,277 B1 | 3/2005 | Monroe et al. |
| 5,835,255 | A | 11/1998 | Miles | 6,862,022 B2 | 3/2005 | Slupe |
| 5,842,088 | A | 11/1998 | Thompson | 6,862,029 B1 | 3/2005 | D'Souza et al. |
| 5,912,758 | A | 6/1999 | Knipe et al. | 6,867,896 B2 | 3/2005 | Miles |
| 5,920,632 | A | 7/1999 | Lubbe et al. | 6,870,581 B2 | 3/2005 | Li et al. |
| 5,986,796 | A | 11/1999 | Miles | 6,870,654 B2 | 3/2005 | Lin et al. |
| 6,028,690 | A | 2/2000 | Carter et al. | 6,882,458 B2 | 4/2005 | Lin et al. |
| 6,038,056 | A | 3/2000 | Florence et al. | 6,882,461 B1 | 4/2005 | Tsai et al. |
| 6,040,937 | A | 3/2000 | Miles | 6,912,022 B2 | 6/2005 | Lin et al. |
| 6,049,317 | A | 4/2000 | Thompson et al. | 6,952,303 B2 | 10/2005 | Lin et al. |
| 6,055,090 | A | 4/2000 | Miles | 6,958,847 B2 | 10/2005 | Lin |
| 6,061,075 | A | 5/2000 | Nelson et al. | 7,061,681 B2 | 6/2006 | Anderson et al. |
| 6,088,474 | A | 7/2000 | Dudasko et al. | 7,123,216 B1 | 10/2006 | Miles |
| 6,091,887 | A | 7/2000 | Dieterle et al. | 7,187,489 B2 | 3/2007 | Miles |
| 6,099,132 | A | 8/2000 | Kaeriyama | 7,343,080 B2 | 3/2008 | Gally et al. |
| 6,113,239 | A | 9/2000 | Sampsell et al. | 2001/0003487 A1 | 6/2001 | Miles |
| 6,147,790 | A | 11/2000 | Meier et al. | 2002/0015215 A1 | 2/2002 | Miles |
| 6,160,833 | A | 12/2000 | Floyd et al. | 2002/0054424 A1 | 5/2002 | Miles |
| 6,180,428 | B1 | 1/2001 | Peeters et al. | 2002/0075555 A1 | 6/2002 | Miles |
| 6,201,633 | B1 | 3/2001 | Peeters et al. | 2002/0126364 A1 | 9/2002 | Miles |
| 6,232,936 | B1 | 5/2001 | Gove et al. | 2002/0157033 A1 | 10/2002 | Cox |
| 6,282,010 | B1 | 8/2001 | Sulzbach et al. | 2002/0171636 A1 | 11/2002 | Aarts et al. |
| 6,285,207 | B1 | 9/2001 | Listwan | 2003/0016361 A1 | 1/2003 | Mank et al. |
| 6,295,154 | B1 | 9/2001 | Laor et al. | 2003/0043157 A1 | 3/2003 | Miles |
| 6,323,982 | B1 | 11/2001 | Hornbeck | 2003/0063081 A1 | 4/2003 | Kimura et al. |
| 6,347,009 | B1 | 2/2002 | Takeuchi | 2003/0072070 A1 | 4/2003 | Miles |
| 6,407,560 | B1 | 6/2002 | Walraven et al. | 2003/0077881 A1 | 4/2003 | Gelmi et al. |
| RE37,847 | E | 9/2002 | Henley et al. | 2003/0112231 A1 | 6/2003 | Kurumisawa |
| 6,447,126 | B1 | 9/2002 | Hornbeck | 2003/0202264 A1 | 10/2003 | Weber et al. |
| 6,465,355 | B1 | 10/2002 | Horsley | 2003/0202265 A1 | 10/2003 | Reboa et al. |
| 6,466,358 | B2 | 10/2002 | Tew | 2003/0202266 A1 | 10/2003 | Ring et al. |
| 6,473,274 | B1 | 10/2002 | Maimone et al. | 2003/0218462 A1 | 11/2003 | Dick et al. |
| 6,480,177 | B2 | 11/2002 | Doherty et al. | 2004/0004610 A1 | 1/2004 | Iwami et al. |
| 6,496,122 | B2 | 12/2002 | Sampsell | 2004/0027636 A1 | 2/2004 | Miles |
| 6,545,335 | B1 | 4/2003 | Chua et al. | 2004/0042000 A1 | 3/2004 | Mehrl et al. |
| 6,548,908 | B2 | 4/2003 | Chua et al. | 2004/0051929 A1 | 3/2004 | Sampsell et al. |
| 6,549,338 | B1 | 4/2003 | Wolverton et al. | 2004/0057043 A1 | 3/2004 | Newman et al. |
| 6,552,840 | B2 | 4/2003 | Knipe | 2004/0058532 A1 | 3/2004 | Miles et al. |
| 6,567,715 | B1 | 5/2003 | Sinclair et al. | 2004/0070400 A1 | 4/2004 | van Spengen |
| 6,574,033 | B1 | 6/2003 | Chui et al. | 2004/0080807 A1 | 4/2004 | Chen et al. |
| 6,589,625 | B1 | 7/2003 | Kothari et al. | 2004/0081438 A1 | 4/2004 | Hahn et al. |
| 6,600,201 | B2 | 7/2003 | Hartwell et al. | 2004/0125281 A1 | 7/2004 | Lin et al. |
| 6,606,175 | B1 | 8/2003 | Sampsell et al. | 2004/0145049 A1 | 7/2004 | McKinnell et al. |
| 6,625,047 | B2 | 9/2003 | Coleman, Jr. | 2004/0145811 A1 | 7/2004 | Lin et al. |
| 6,630,786 | B2 | 10/2003 | Cummings et al. | 2004/0147056 A1 | 7/2004 | McKinnell et al. |
| 6,632,698 | B2 | 10/2003 | Ives | 2004/0147198 A1 | 7/2004 | Lin et al. |
| 6,643,069 | B2 | 11/2003 | Dewald | 2004/0160143 A1 | 8/2004 | Shreeve et al. |
| 6,650,455 | B2 | 11/2003 | Miles | 2004/0174583 A1 | 9/2004 | Chen et al. |
| 6,666,561 | B1 | 12/2003 | Blakley | 2004/0175577 A1 | 9/2004 | Lin et al. |
| 6,674,090 | B1 | 1/2004 | Chua et al. | 2004/0179281 A1 | 9/2004 | Reboa |
| 6,674,562 | B1 | 1/2004 | Miles | 2004/0206953 A1 | 10/2004 | Morena et al. |
| 6,680,792 | B2 | 1/2004 | Miles | 2004/0207897 A1 | 10/2004 | Lin |
| 6,710,908 | B2 | 3/2004 | Miles et al. | 2004/0209192 A1 | 10/2004 | Lin et al. |
| 6,711,283 | B1 | 3/2004 | Soenksen | 2004/0209195 A1 | 10/2004 | Lin |
| 6,741,377 | B2 | 5/2004 | Miles | 2004/0212026 A1 | 10/2004 | Van Brocklin et al. |
| 6,741,384 | B1 | 5/2004 | Martin et al. | 2004/0217378 A1 | 11/2004 | Martin et al. |
| 6,741,503 | B1 | 5/2004 | Farris et al. | 2004/0217919 A1 | 11/2004 | Pichl et al. |
| 6,747,785 | B2 | 6/2004 | Chen et al. | 2004/0218251 A1 | 11/2004 | Piehl et al. |
| 6,747,800 | B1 | 6/2004 | Lin | 2004/0218334 A1 | 11/2004 | Martin et al. |
| 6,750,152 | B1 | 6/2004 | Christenson et al. | 2004/0218341 A1 | 11/2004 | Martin et al. |
| 6,753,528 | B1 | 6/2004 | Nikoonahad et al. | 2004/0227493 A1 | 11/2004 | Van Brocklin et al. |
| 6,763,702 | B2 | 7/2004 | Chien et al. | 2004/0240032 A1 | 12/2004 | Miles |
| 6,775,174 | B2 | 8/2004 | Huffman et al. | 2004/0240138 A1 | 12/2004 | Martin et al. |

| | | | |
|---|---|---|---|
| 2004/0245588 A1 | 12/2004 | Nikkel et al. | |
| 2004/0262604 A1 | 12/2004 | Lee | |
| 2004/0263944 A1 | 12/2004 | Miles et al. | |
| 2005/0001828 A1 | 1/2005 | Martin et al. | |
| 2005/0003667 A1 | 1/2005 | Lin et al. | |
| 2005/0024557 A1 | 2/2005 | Lin | |
| 2005/0035699 A1 | 2/2005 | Tsai | |
| 2005/0036095 A1 | 2/2005 | Yeh et al. | |
| 2005/0036192 A1 | 2/2005 | Lin et al. | |
| 2005/0038950 A1 | 2/2005 | Adelmann | |
| 2005/0042117 A1 | 2/2005 | Lin | |
| 2005/0046922 A1 | 3/2005 | Lin et al. | |
| 2005/0046948 A1 | 3/2005 | Lin | |
| 2005/0057442 A1 | 3/2005 | Way | |
| 2005/0068583 A1 | 3/2005 | Gutkowski et al. | |
| 2005/0068605 A1 | 3/2005 | Tsai | |
| 2005/0068606 A1 | 3/2005 | Tsai | |
| 2005/0069209 A1 | 3/2005 | Damera-Venkata et al. | |
| 2005/0078348 A1 | 4/2005 | Lin | |
| 2005/0168849 A1 | 8/2005 | Lin | |
| 2005/0195462 A1 | 9/2005 | Lin | |
| 2005/0202649 A1 | 9/2005 | Hung et al. | |
| 2005/0249966 A1 | 11/2005 | Tung et al. | |
| 2006/0066935 A1 | 3/2006 | Cummings et al. | |
| 2007/0097134 A1 | 5/2007 | Miles | |

FOREIGN PATENT DOCUMENTS

| | | |
|---|---|---|
| CH | 6855887 | 10/1995 |
| CN | 86101504 | 9/1987 |
| DE | 19525081 | 1/1997 |
| EP | 0 566 500 | 10/1993 |
| EP | 1065645 | 1/2001 |
| FR | 2516785 | 5/1983 |
| GB | 1 293 569 | 10/1972 |
| GB | 2030721 | 4/1980 |
| JP | 01259243 | 1/1990 |
| JP | 3002540 A | 1/1991 |
| JP | 11 337412 | 3/2000 |
| WO | WO 95/30924 | 11/1995 |
| WO | WO 97/17628 | 5/1997 |
| WO | WO 99/52006 A2 | 10/1999 |
| WO | WO 99/52006 A3 | 10/1999 |
| WO | WO 01/69310 A1 | 9/2001 |
| WO | WO 02/093116 A1 | 11/2002 |
| WO | WO 03/007049 A1 | 1/2003 |
| WO | WO 03/069413 A1 | 8/2003 |
| WO | WO 03/073151 A1 | 9/2003 |
| WO | WO 2004/006003 A1 | 1/2004 |
| WO | WO 2004/025239 A2 | 3/2004 |
| WO | WO 2004/026757 A2 | 4/2004 |
| WO | WO 2005/001410 A1 | 1/2005 |

OTHER PUBLICATIONS

Aratani et al., "Process and Design Considerations for Surface Micromachined Beams for a Tuneable Interferometer Array in Silicon," Proc. IEEE Microelectromechanical Workshop, Fort Lauderdale, FL, pp. 230-235 (Feb. 1993).

Aratani et al., "Surface Micromachined Tuneable Interferometer Array," Sensors and Actuators, pp. 17-23 (1994).

Conner, "Hybrid Color Display Using Optical Interference Filter Array," SID Digest, pp. 577-580 (1993).

Durr et al., "Reliability Test and Failure Analysis of Optical MEMS", Proceedings of the 9th International Symposium on the Physical and Failure Analysis of Integrated Circuits, pp. 201-206, (Jul. 8-12, 2002).

Goosen et al., "Possible Display Applications of the Silicon Mechanical Anti-Reflection Switch," Society for Information Display (1994).

Goosen et al., "Silicon Modulator Based on Mechanically-Active Anti-Reflection Layer with 1Mbit/sec Capability for Fiber-in-the-Loop Applications," IEEE Photonics Technology Letters (Sep. 1994).

Gosch, "West Germany Grabs the Lead in X-Ray Lithography," Electronics, pp. 78-80 (Feb. 5, 1987).

Harpster Timothy J et al., "A Passive Humidity Monitoring System for In Situ Remote Wireless Testing of Micropackages," J Microelectromech Syst. vol. 11, No. 1, p. 61-67, (2002).

Howard et al., "Nanomater-Scale Fabrication Techniques," VLSI Electronics: Microstructure Science, vol. 5, pp. 145-153 and pp. 166-173 (1982).

Jackson, "Classical Electrodynamics," John Wiley & Sons Inc., pp. 568-573 (date unknown).

Jerman et al., "A Miniature Fabry-Perot Interferometer with a Corrugated Silicon Diaphragm Support," IEEE Electron Devices Society (1988).

Johnson "Optical Scanners," Microwave Scanning Antennas, vol. 1, pp. 251-261 (1964).

Light over Matter, Circle No. 36 (Jun. 1993).

Miles, "A New Reflective FPD Technology Using Interferometric Modulation," Society for Information display '97 Digest, Session 7.3.

Miles, "Interferometric Modulation:MOEMS as an Enabling Technology for High-Perfomorance Reflective Displays," Proceedings of the SPIE, vol. 4985, p. 131-139. (2003).

Miles et al., "Digital Paper™ for Reflective Displays," J. of the Society for Information Display Soc. Inf. Display USA. vol. 11, No. 1, p. 209-215. (2003).

Newsbreaks, "Quantum-trench devices might operate at terahertz frequencies," Laser Focus World (May 1993).

Oliner et al., "Radiating Elements and Mutual Coupling," Microwave Scanning Antennas, vol. 2, p. 131-194 (1966).

Raley et al., "A Fabry-Perot Microinterferometer for Visible Wavelengths," IEEE Solid-State Sensor and Actuator Workshop, Hilton-Head, SC (1992).

"Reflection/backscattering Probes," Ocean Optics, Inc, Internet Article, p. 1-3. XP-002358482. URL:http://web.archive.org/web/20040619022333/www.oceanoptics.com/products/reflectionprobes.asp> etrieved on Jun. 19, 2004.

"Reflection/backscattering Probes", retrieved from the Internet: URL: http://web.archive.org/web/20011225001534/oceanoptics.com/products/reflectionprobes. asp [retrieved on Dec. 25, 2001].

Roveti, "Choosing a Humidity Sensor: A Review of Three Technologies", http://www.sensormag.com/articles/0701/54/main.shtml, (published prior to Sep. 17, 2004).

Skaggs et al, "Automatic Testing of the Digital Micromirror Device", IEEE/LEOS 1996 Summer Topical Meetings, pp. 11-12, (Aug. 5-9, 1996).

Sperger et al., "High Performance Patterned All-Dielectric Interference Colour Filter for Display Applications," SID Digest, pp. 81-83 (1994).

Stone, "Radiation and Optics, An Introduction to the Classical Theory," McGraw-Hill, pp. 340-343 (1963).

Tabata et al., "In Situ Observation and Analysis of Wet Etching Process for Micro Electro-mechanical systems," Proc. Of the Workshop on Micro Electro Mechanical Systems, vol. Workshop 4. p. 99-102, (1991).

Walker, et al., "Electron-beam-tunable interference Filter Spatial Light Modulator," Optics Letters vol. 13, No. 5, pp. 345-347 (May 1988).

Waelti M. et al., "Package Quality Testing Using Integrated Pressure Sensor," Proc. Of the SPIE, vol. 3582, p. 981-986, (1998).

Winton, John M., "A novel way to capture solar energy," Chemical Week, pp. 17-18 (May 15, 1985).

Wu, "Design of a Reflective Color LCD Using Optical Interference Reflectors," ASIA Display '95, pp. 929-931 (Oct. 16, 1995).

International Search Report PCT Application No. PCT/US2005/029819, Dated Feb. 15, 2006.

Dokmeci, et al. *A High-Sensitivity Polyimide Capacitive Relative Humidity Sensor for Monitoring Anodically Bonded Hermetic Micropackages* Journal of Microelectromechanical Systems, vol. 10, No. 2, Jun. 2001, 197-204.

Jin, et al. "*MEMS Vacuum Packaging Technology and Applications*" Electronics Packaging Technology, 2003, 5$^{th}$ Conference, Dec. 10-12, 2003, Piscataway, NJ, pp. 301-306.

Tominette, et al, Moisture and Impurities Detection and removal in Packaged MEMS, proceeding of SPIE vol. 4558, (2001), pp. 215-225.

International Search Report and Written opinion for PCT/US05/029819 mailed on Jun. 26, 2006.

Drieenhuizen, et al., "Comparison of Techniques for measuring Both Compressive and Tensile Stress in Thin Films." *Sensors and Actuators*, vol. 37-38, pp. 759-765. (1993).

Guckel et al., "Fine-Grained Polysilicon Films with Built-In Tensile Strain," *IEEE Transactions on Electron Devices*, vol. 35, no. 6, pp. 801-802, (1988).

"High-reflectivity Specular Reflectance standard," [Online] XP002374849, (URL:http://web.archive.org/web/20040220134330/www.oceanoptics.com/products/stan.ss1.asp> (retrieved on Feb. 20, 2004).

Lin et al., "A Micro Strain Gauge with Mechanical Amplifier," *J. of Microelectromechanical Systems*, vol. 6, No. 4, (1997).

"Low-reflectivity Specular Reflectance Standard," Internet Article, XP002374848 <URL:http://web.archive.org/web/20040220134257/www.oceanoptics.com/Productsstan.ss1.asp> (retrieved on Feb. 20, 2004).

Pruessner et al., "Mechanical Property Measurement of InP-based MEMS for optical communications," *Sensors and Actuators*, vol. 105, pp. 190-200, (2003).

"S2000 Miniature Fiber Optic Spectrometer", Internet Article, XP002358483, pp. 1-2, <URL:http://web.archive.org/web/20040617035842/www.oceanoptics.com/products/s2000.asp> (Retrieved Jun. 17, 2004).

Singh et al., "Strain Studies in LPCVD Polysilicon for Surface Micromachined Devices," *Sensors and Actuators*, vol. 77, pp. 133-138, (1999).

Srikar et al., "A Critical Review of Microscale Mechanical Testing Methods Used in the Design of Microelectromechanical Systems," *Society for Experimental mechanics*, vol. 43, no. 3, (2003).

Zhang, et al., "Measurements of Residual Stresses in Thin Films Using Micro-Rotating-Structures." *Thin Solid Films*, vol. 335, pp. 97-105, (1998).

Extended European Search Report for Appl. No. 05255672.7.

Austrian Search Report No. 74/2005, mailed on May 10, 2005.

Miles, "5.3: Digital Paper™: Reflective Displays Using Interferometric Modulation," SID 00 Digest, pp. 32-35 (2000).

IPRP for PCT/US05/030378 filed Aug. 25, 2005.

IPRP for PCT/US05/034307 filed Sep. 23, 2005.

Mile, M.W., "MEMS-based interferometric modulator for display applications", Sep. 1999, Proc. SPIE, vol. 3876, pp. 20-28.

Sharma and Trussell, "Digital Color Imaging", 1997, IEEE Transactions on Image Processing, vol. 6, No. 7, pp. 901-932.

Ocean Optics "High-Reflectivity Specular Reflectance Standard", retrieved from the Internet: URL: http://web.archive.org/web/20030616003610/oceanoptics.com/products/stan-ssh.asp [retrieved on Jun. 16, 2003].

Ocean Optics, "Low-Reflectivity Specular Reflectance Standard", retrieved from the Internet: URL: http://web.archive.org/web/20030614185739/oceanoptics.com/products/stan-ssl.asp [retrieved on Jun. 14, 2003].

International Search Report PCT Application No. PCT/US2005/030378, dated Apr. 18, 2006.

ISR and WO for PCT Application No. PCT/US2005/034464, filed Sep. 23, 2005.

IPR for fpr PCT/US05/033221 filed Sep. 16, 2005.

Office Action mailed on Dec. 19, 2006 in U.S. Appl. No. 11/281,136.

Office Action mailed on May 18, 2007 in U.S. Appl. No. 11/173,822.

IPRP for PCT/US05/029819 filed Aug. 22, 2005.

Office Action dated Sep. 17, 2008 in U.S. Appl. No. 12/021,218.

Office Action dated Dec. 19, 2008, in Chinese App. No. 200710109457.6.

|  | Column Output Signals | |
|---|---|---|
|  | $+V_{bias}$ | $-V_{bias}$ |
| 0 | Stable | Stable |
| $+\Delta V$ | Release | Actuate |
| $-\Delta V$ | Actuate | Release |

Row Output Signals

SYSTEM AND METHOD OF TESTING HUMIDITY IN A SEALED MEMS DEVICE

RELATED APPLICATIONS

This application is a continuation of and claims priority from, under 35 U.S.C. § 120, U.S. application Ser. No. 11/173,822, filed Jul. 1, 2005 which is hereby incorporated by reference. U.S. application Ser. No. 11/173,822 also claimed priority under 35 U.S.C. § 119(e) from provisional application No. 60/613,567 filed Sep. 27, 2004, which is hereby incorporated by reference.

BACKGROUND

1. Field of the Invention

The field of the invention relates to microelectromechanical systems (MEMS).

2. Description of the Related Technology

Microelectromechanical systems (MEMS) include micro mechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

Furthermore, in the prior art, it was not recognized that there has been a need to check or measure the level of humidity (relative humidity) inside an MEMS device after the MEMS package fabrication is complete so as to, for example, evaluate the lifetime of the device or determine whether the package is defective or not.

SUMMARY OF CERTAIN EMBODIMENTS

The system, method, and devices of the invention each have several aspects, no single one of which is solely responsible for its desirable attributes. Without limiting the scope of this invention, its more prominent features will now be discussed briefly. After considering this discussion, and particularly after reading the section entitled "Detailed Description of Certain Embodiments" one will understand how the features of this invention provide advantages over other display devices.

One embodiment provides a method of testing humidity. The method comprises determining a property of a device which encloses a plurality of interferometric modulators, and determining a relative humidity value or a degree of the relative humidity inside the device based at least in part upon the determined property.

Another embodiment provides a system for testing humidity. The system comprises means for determining a property of a device which encloses a plurality of interferometric modulators, and means for determining a relative humidity value or a degree of the relative humidity inside the device based at least in part upon the determined property.

Another embodiment provides a method of testing humidity. The method comprises measuring i) a first weight of a first device which encloses a plurality of interferometric modulators and ii) a second weight of a second device which encloses a plurality of interferometric modulators, wherein the first and second devices contain a different amount of water vapor. The method also comprises comparing the weights of the first and second devices, and determining a relative humidity value or a degree of the relative humidity inside one of the two devices based at least in part upon the weight comparison.

Another embodiment provides a system for testing humidity. The system comprises a first device enclosing a plurality of interferometric modulators, and a second device enclosing a plurality of interferometric modulators, wherein the first and second devices contain a different amount of water vapor. The system also comprises a scale configured to measure the weights of the first and second devices, wherein a relative humidity value or a degree of the relative humidity inside one of the two devices is determined based at least in part upon the measured weights.

Another embodiment provides a method of testing humidity. The method comprises measuring i) a weight of a device which encloses a plurality of interferometric modulators and ii) an average weight of a plurality of devices each enclosing a plurality of interferometric modulators, wherein at least one of the plurality of devices contains a different amount of water vapor from that of the device. The method also comprises comparing the weight of the device with the average weight; and determining a relative humidity value or a degree of the relative humidity inside the device based at least in part upon the weight comparison.

Another embodiment provides a method of testing humidity. The method comprises providing a device which encloses i) a plurality of interferometric modulators and ii) a desiccant, wherein the desiccant is configured to change its color based on an amount of water vapor absorbed therein. The method also comprises determining a degree of a color change of the desiccant, and determining a relative humidity value or a degree of the relative humidity inside the device based at least in part upon the determined degree of the color change.

Another embodiment provides a method of manufacturing a microelectromechanical systems (MEMS) device. The method comprises providing a substrate, forming a plurality of interferometric modulators on the substrate, providing a desiccant configured to change its color based on an amount of water vapor absorbed therein, and providing a backplate. The method also comprises joining the substrate and the backplate so as to form a device which encloses the plurality of interferometric modulators and the desiccant, wherein the backplate includes at least one transparent portion through which the color change of the desiccant can be viewed from the outside of the device.

Another embodiment provides a microelectromechanical systems (MEMS) device. The system comprises a substrate, a plurality of interferometric modulators formed on the substrate; a desiccant configured to change its color based on an amount of water vapor absorbed therein, and a backplate. The substrate and backplate are joined to each other so as to form a device which encloses the plurality of interferometric modulators and the desiccant, wherein the backplate includes at least one transparent portion through which the color change of the desiccant can be viewed from the outside of the device.

Another embodiment provides a method of testing humidity. The method comprises providing a device which encloses a plurality of interferometric modulators, measuring a resistance of at least one interior part of the device, and determining a relative humidity value or a degree of the relative humidity inside the device based at least in part upon the measured resistance.

Another embodiment provides a system for testing humidity. The system comprises a device enclosing a plurality of interferometric modulators, and a resistive sensor configured to measure a resistance of at least one interior part of the device, wherein a relative humidity value or a degree of the relative humidity inside the device is determined based at least in part upon the measured resistance.

Another embodiment provides a method of testing humidity. The method comprises i) providing a device which encloses a plurality of interferometric modulators, ii) operably contacting an outside area of the device with a cold finger device, set at a first temperature, iii) determining whether frost forms in an inside area of the interferometric modulator device to the contacted area, and iv) determining a relative humidity value or a degree of the relative humidity inside the interferometric modulator device based at least in part upon whether frost has formed in the inside area.

Another embodiment provides a system for testing humidity. The system comprises a device enclosing a plurality of interferometric modulators, and a cold finger device configured to make an operable contact with an outside area of the device. A relative humidity value or a degree of the relative humidity inside the interferometric modulator device is determined based at least in part upon whether frost has formed in the inside area.

Still another embodiment provides a method of testing humidity. The method comprises providing a device which encloses a plurality of interferometric modulators, and operably contacting an outside area of the device with a cold finger device. The method also comprises determining whether frost forms in an inside area of the interferometric modulator device corresponding to the contacted area, and measuring a resistance of at least one interior part of the interferometric modulator device. The method further comprises determining a relative humidity value or a degree of the relative humidity inside the interferometric modulator device based at least in part upon the combination of i) whether frost has formed in the inside area and ii) the measured resistance.

Still another embodiment provides a system for testing humidity. The system comprises i) a device enclosing a plurality of interferometric modulators, ii) a cold finger device configured to make an operable contact with an outside area of the interferometric modulator device, and iii) a resistive sensor configured to measure a resistance of at least one interior part of the interferometric modulator device. A relative humidity value or a degree of the relative humidity inside the interferometric modulator device is determined based at least in part upon the combination of i) whether frost has formed in the inside area and ii) the measured resistance.

Yet another embodiment provides a method of testing humidity. The method comprises providing a device which encloses a plurality of interferometric modulators, and measuring a first weight of the device. The method also comprises measuring a second weight of the device after a predetermined period of time, and comparing the first and second weights, and determining a relative humidity value or a degree of the relative humidity inside the device based at least in part upon the weight comparison.

Yet another embodiment provides a method of testing humidity. The method comprises providing a device which encloses i) a plurality of interferometric modulators and ii) a desiccant, measuring a first weight of the device, and providing water vapor into the inside of the device. The method also comprises measuring a second weight of the device after the water vapor has been provided into the device, comparing the first and second weights, and determining a degree of the relative humidity inside the device based at least in part upon the weight comparison.

DETAILED DESCRIPTION OF CERTAIN EMBODIMENTS

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

One embodiment provides a method of testing humidity, which comprises i) exposing a device which encloses a plurality of interferometric modulators to a humid environment, ii) determining a property (weight, resistance, desiccant color change, temperature where frost forms, etc.) and iii) determining a relative humidity value or a degree of the relative humidity inside the device based at least in part upon the determined property.

Figure 1:
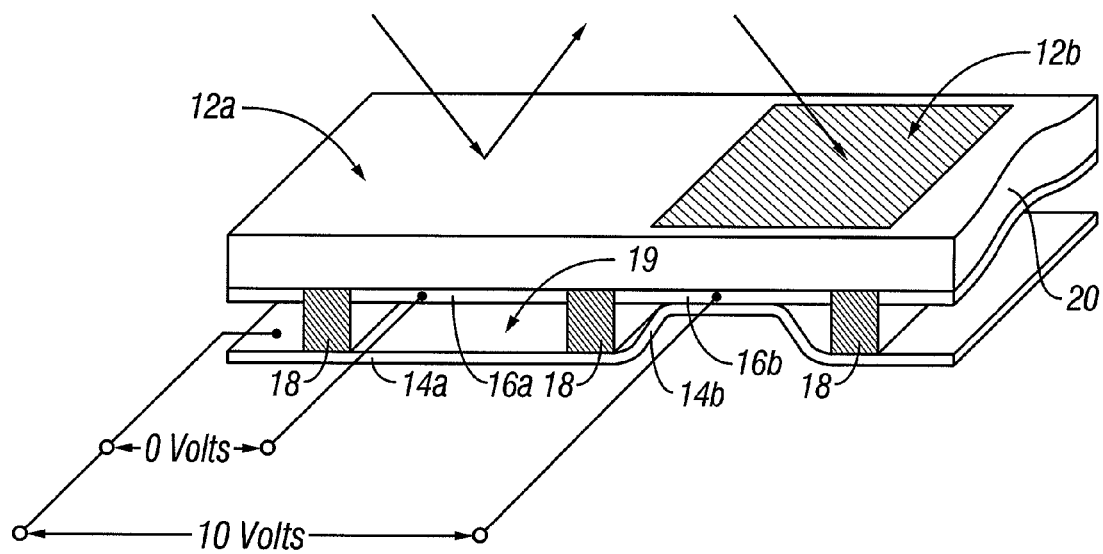
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise of several fused layers, which can include an electrode layer, such as indium tin oxide (ITO), a partially reflective layer, such as chromium, and a transparent dielectric. The optical stack 16 is thus electrically conductive, partially transparent and partially reflective, and may be fabricated, for example, by depositing one or more of the above layers onto a transparent substrate 20. In some embodiments, the layers are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the cavity 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5 illustrate one exemplary process and system for using an array of interferometric modulators in a display application.

Figure 2:
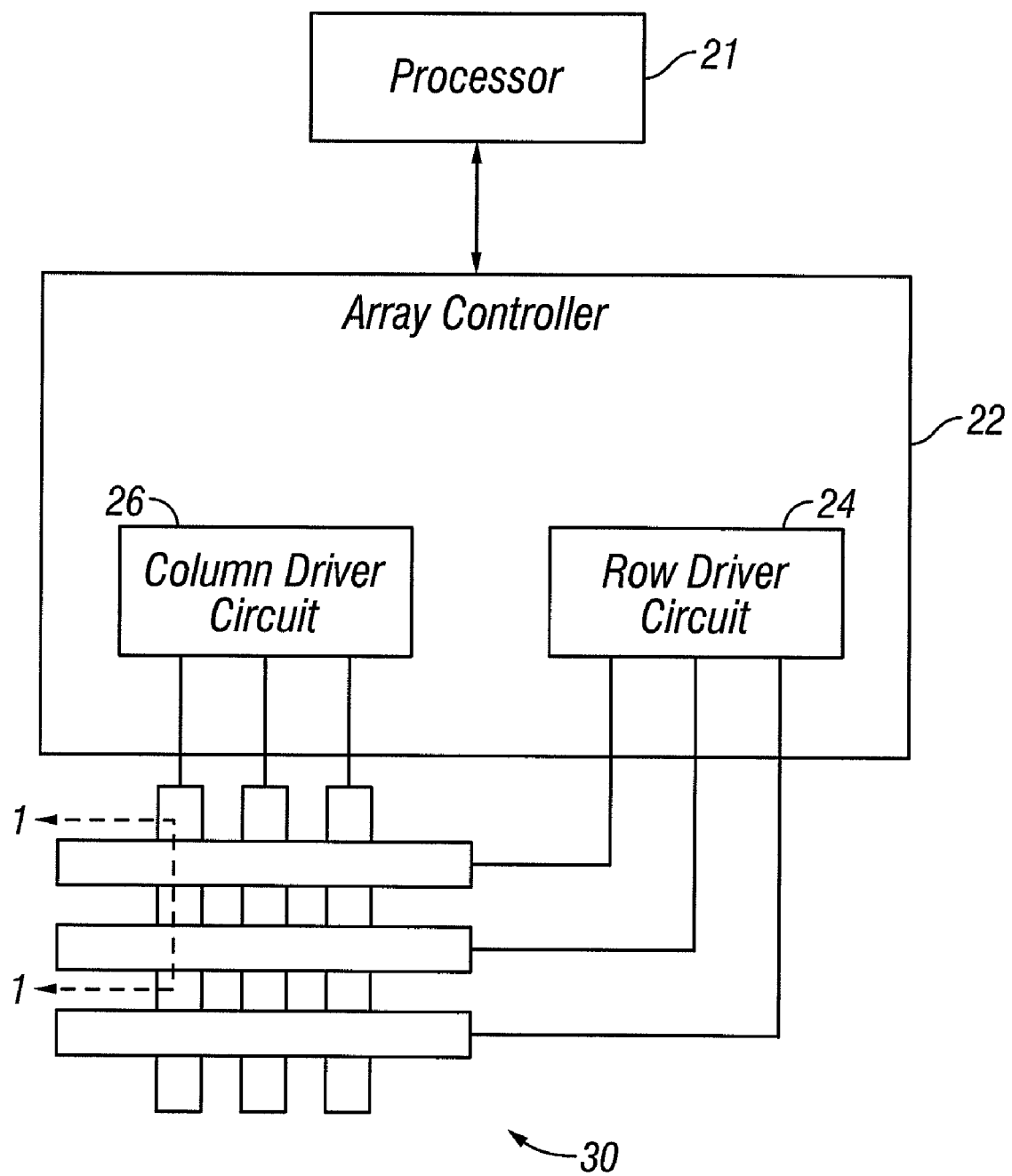
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. There is thus a range of voltage, about 3 to 7 V in the example illustrated in FIG. 3, where there exists a window of applied voltage within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
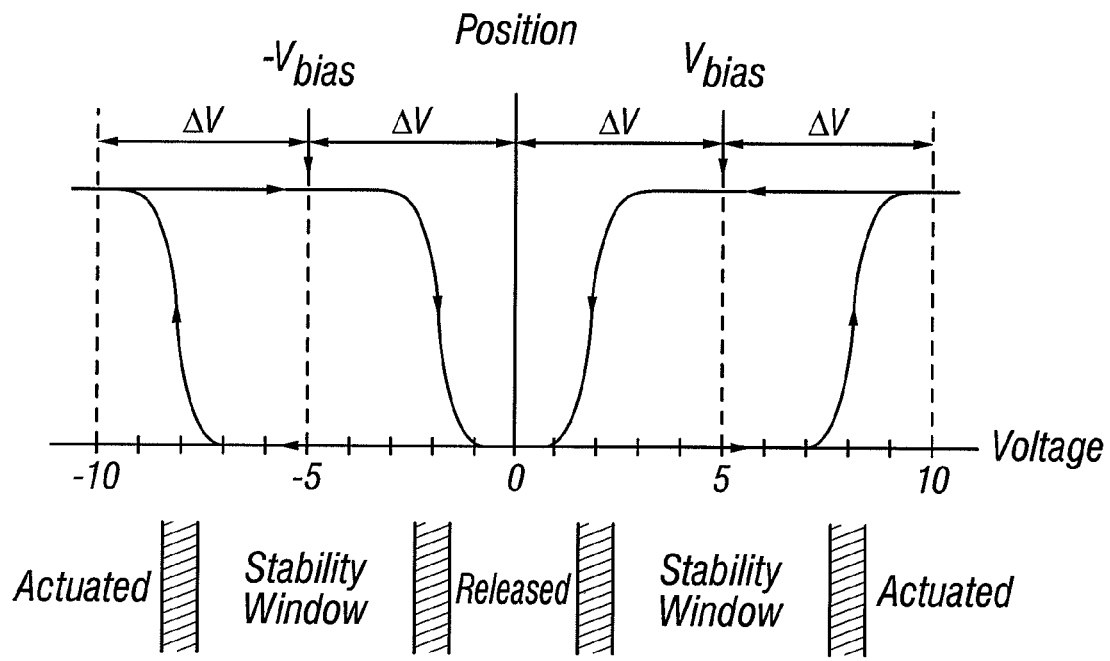
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.

FIGS. 4 and 5 illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to $-5$ volts and $+5$ volts respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

Figure 5A:
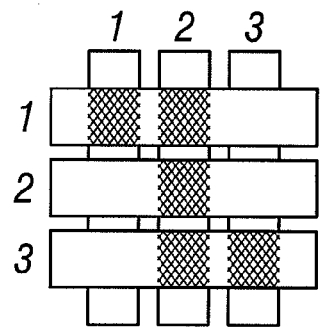
FIGS. 5A and 5B illustrate one exemplary timing diagram for row and column signals that may be used to write a frame of display data to the 3×3 interferometric modulator display of FIG. 2.
Figure 5B:
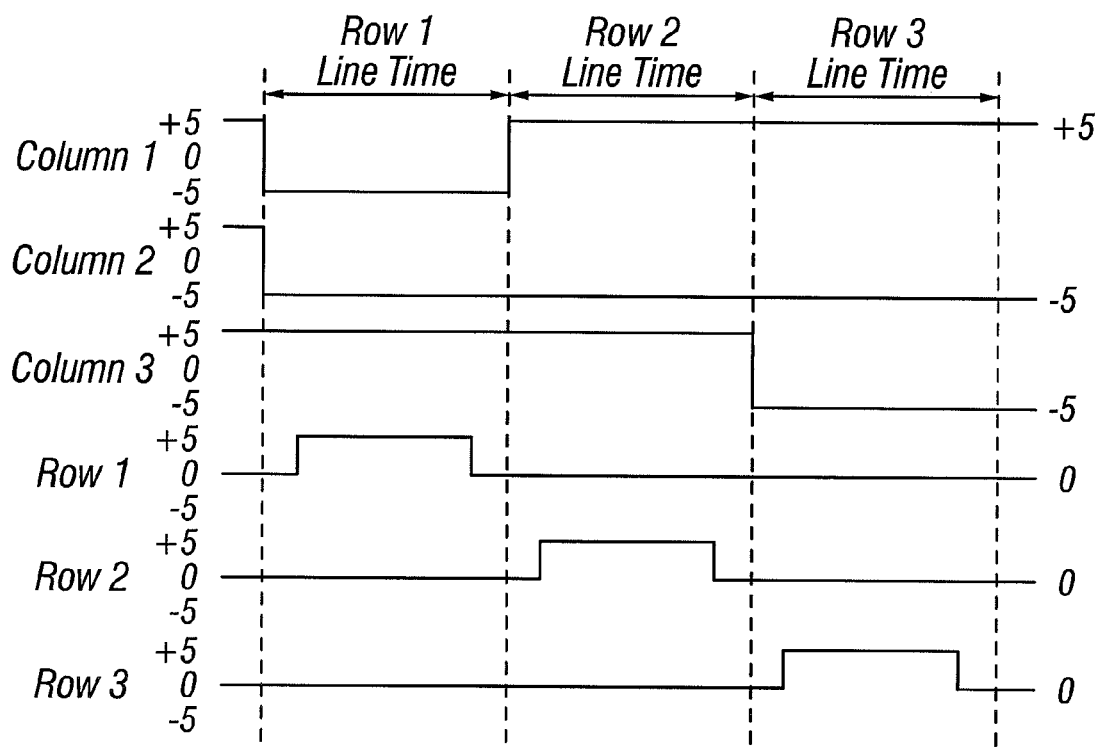

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
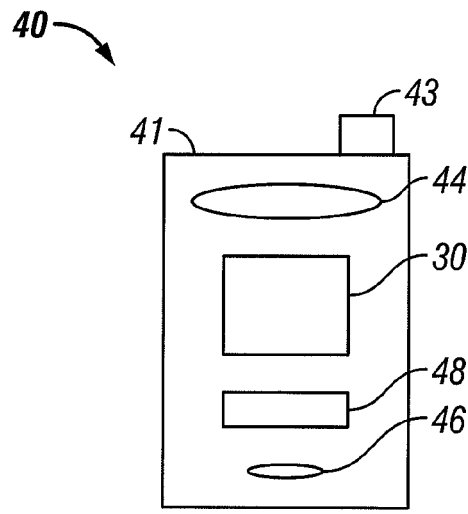
FIGS. 6A and 6B are system block diagrams illustrating an embodiment of a visual display device comprising a plurality of interferometric modulators.
Figure 6B:
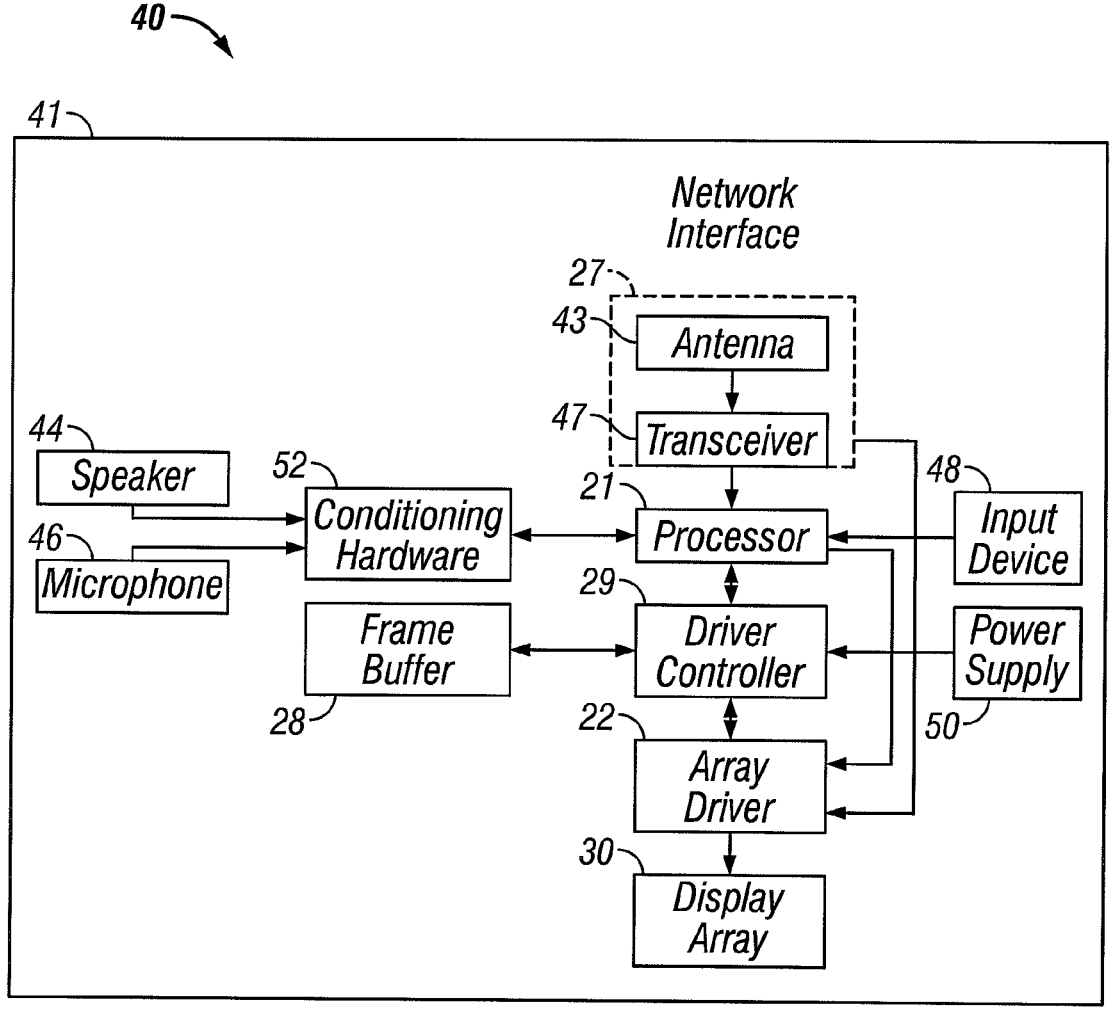

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 44, an input device 48, and a microphone 46. The housing 41 is generally formed from any of a variety of manufacturing processes as are well known to those of skill in the art, including injection molding, and vacuum forming. In addition, the housing 41 may be made from any of a variety of materials, including but not limited to plastic, metal, glass, rubber, and ceramic, or a combination thereof. In one embodiment the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g. filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell, including a plastic solar cell, and solar-cell paint. In another embodiment, power supply 50 is configured to receive power from a wall outlet.

In some implementations control programmability resides, as described above, in a driver controller which can be located in several places in the electronic display system. In some cases control programmability resides in the array driver 22. Those of skill in the art will recognize that the above-described optimization may be implemented in any number of hardware and/or software components and in various configurations.

Figure 7A:
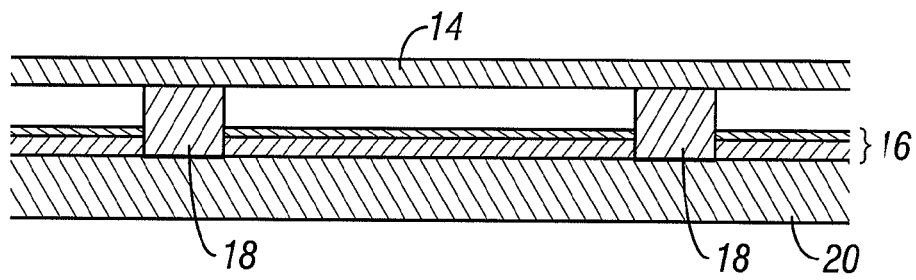
FIG. 7A is a cross section of the device of FIG. 1.
Figure 7B:
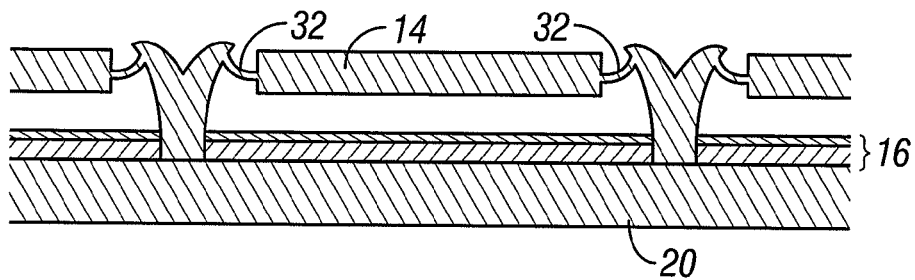
FIG. 7B is a cross section of an alternative embodiment of an interferometric modulator.
Figure 7C:
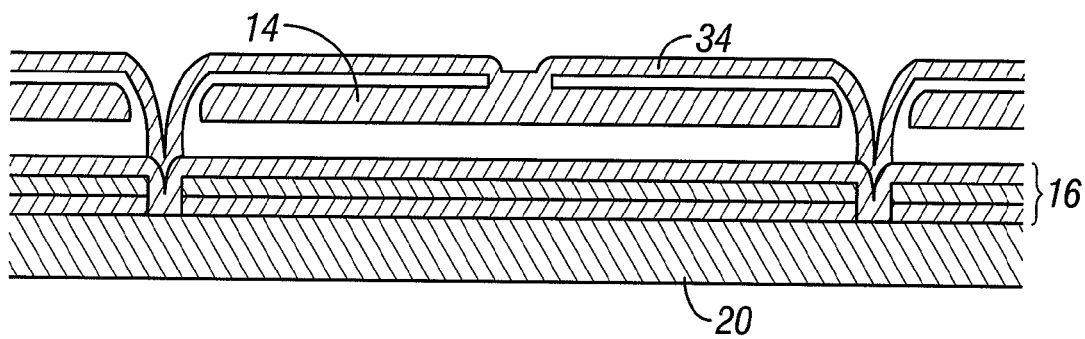
FIG. 7C is a cross section of another alternative embodiment of an interferometric modulator.
Figure 7D:
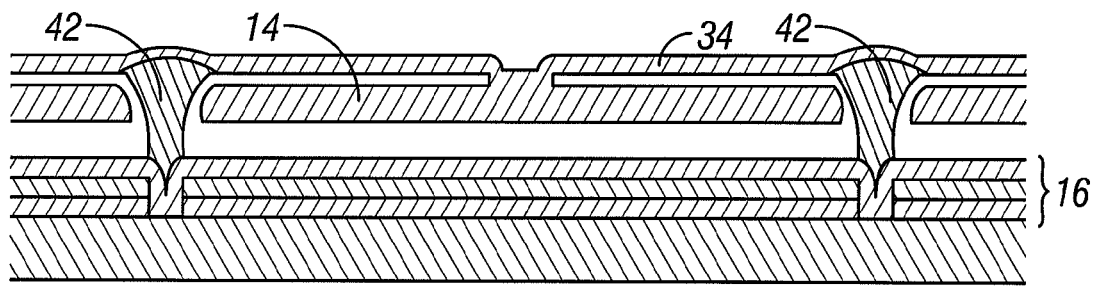
FIG. 7D is a cross section of yet another alternative embodiment of an interferometric modulator.
Figure 7E:
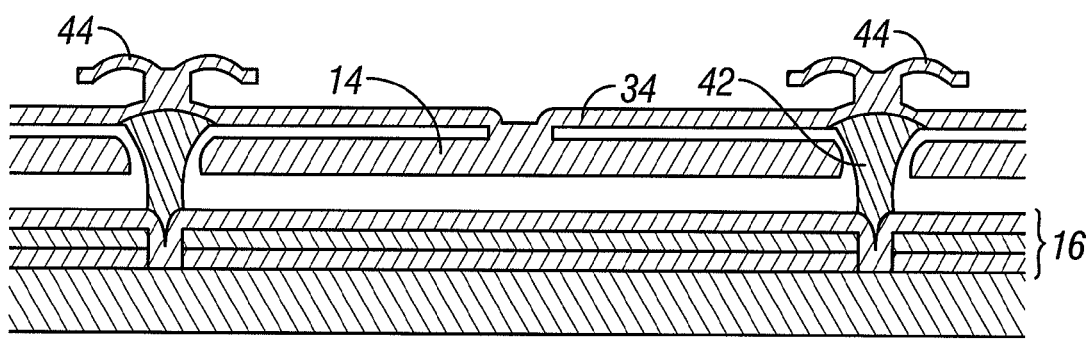
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports at the corners only, on tethers 32. In FIG. 7C, the moveable reflective layer 14 is suspended from a deformable layer 34, which may comprise a flexible metal. The deformable layer 34 connects, directly or indirectly, to the substrate 20 around the perimeter of the deformable layer 34. These connections are herein referred to as support posts. The embodiment illustrated in FIG. 7D has support post plugs 42 upon which the deformable layer 34 rests. The movable reflective layer 14 remains suspended over the cavity, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

Generally, interferometric modulators have a higher tolerance for humidity requirements than that of OLED devices. As discussed above, it is possible that water vapor permeates into the package even if it is semi-hermetically or hermetically sealed. In certain embodiments where a desiccant is placed in the interior of the package, a certain amount of moisture permeation may be tolerated depending on the capacity of the desiccant. However, if there exists moisture or water vapor which is higher than the tolerance level, or more water permeation into the package than desired, the interferometric modulator display device is likely to have a shortened lifetime or may fail to properly operate. Also, in certain packages, moisture, which has been created and/or permeated during the assembly, may not have been properly removed before completing the fabrication of the package. Furthermore, the relative humidity level in the interior of the package, particularly, without a desiccant therein, should be maintained less than a certain level in order that the device operates for its intended purpose or to have an expected lifetime. Thus, there has been a need to check or measure the level of humidity (relative humidity) inside the package after the package fabrication is complete so as to, for example, evaluate the lifetime of the device or determine whether the package is defective or not.

Figure 8:
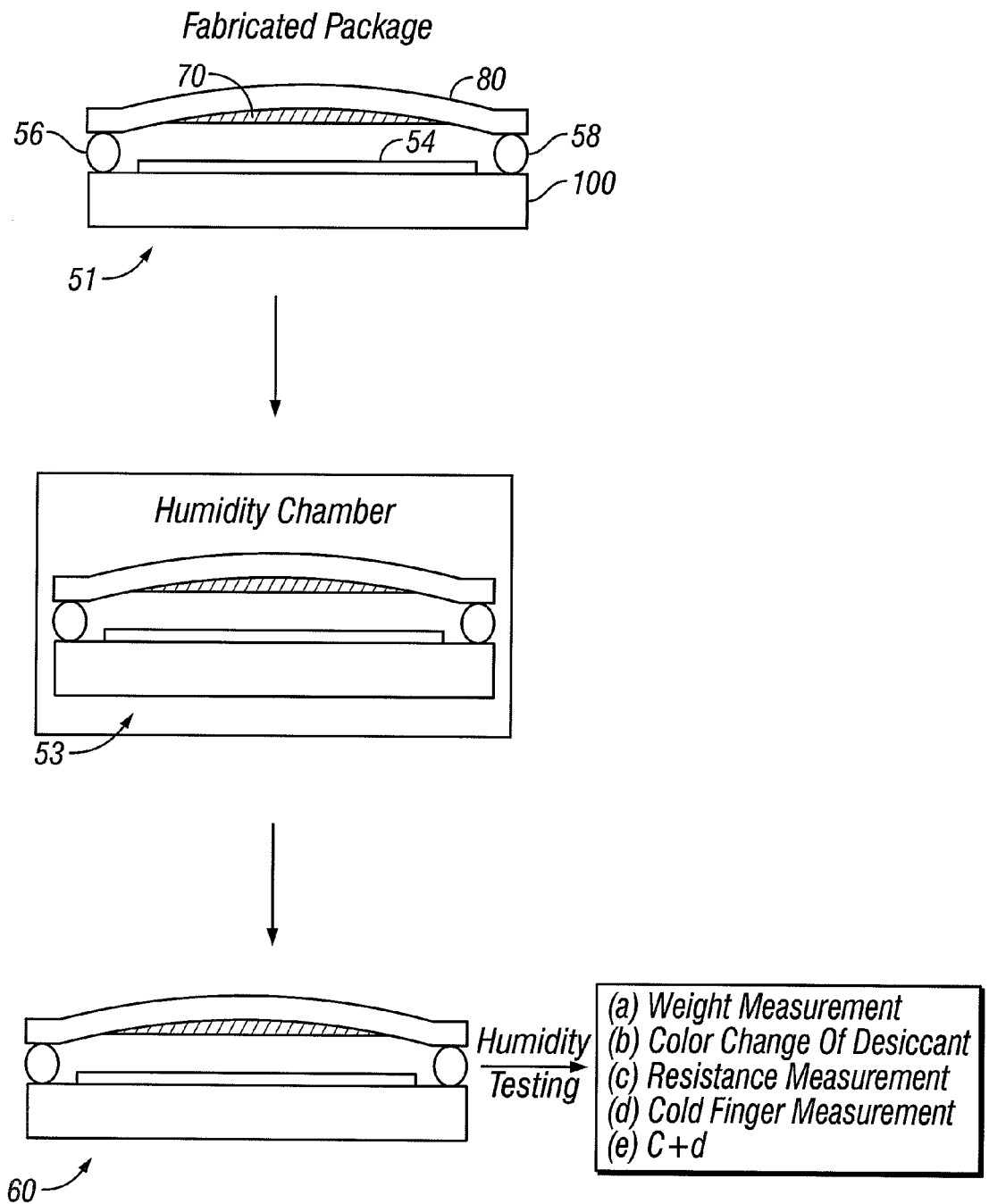
FIG. 8 is a conceptual diagram showing a process of humidity testing in the inside of the package according to embodiments of the invention.
Figure 13:
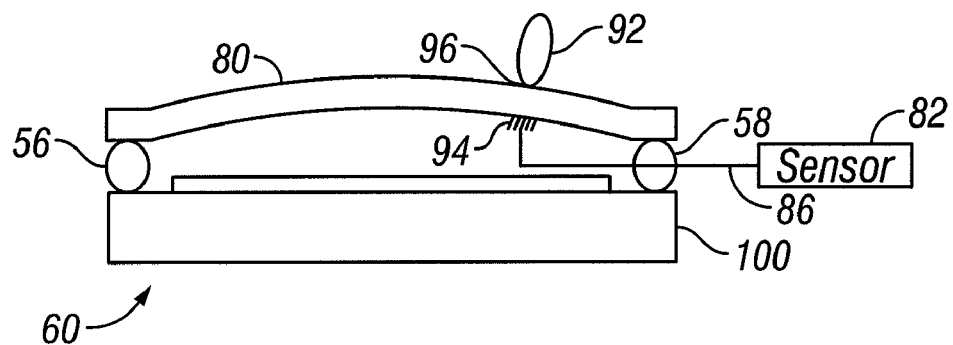
FIG. 13 illustrates a humidity testing process according to yet another embodiment of the invention.
Figure 14:
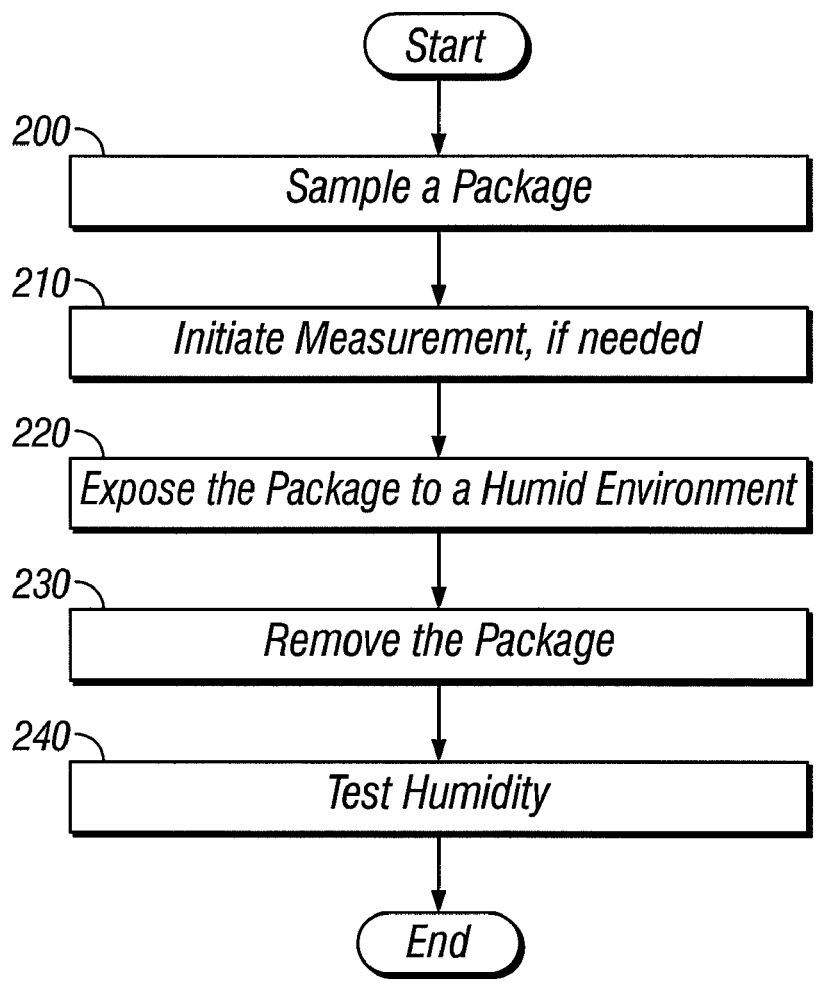
FIG. 14 illustrates an exemplary flowchart for explaining a humidity testing process according to embodiments of the invention.

FIG. 8 illustrates a conceptual diagram showing a process of humidity testing in the inside of the package according to embodiments of the invention. FIG. 14 illustrates an exemplary flowchart for explaining a humidity testing process according to embodiments of the invention. Referring to FIGS. 8-14, the humidity testing procedure of various embodiments will be described in more detail.

First, a fabricated package 51 for humidity testing is sampled (selected) (200). As shown in FIG. 8, the fabricated package 51 includes a substrate 100 and a backplate 80. An interferometric modulator array 54, including a plurality of interferometric modulators, is encapsulated within the package 51. The substrate 100 and backplate 80 may be or may not be transparent. Seals 56 and 58 are typically provided to join the substrate 100 and backplate 80 to form the fabricated package 51. Depending on embodiments, the seals 56 and 58 may be a non-hermetic, semi-hermetic, or hermetic seal.

In one embodiment, a desiccant 70 is provided within the package structure 51 to reduce moisture within the package structure 51. In one embodiment, the desiccant 70 is positioned between the interferometric modulator array 54 and the backplate 80. Desiccants may be used for packages that have either hermetic or semi-hermetic seals. In one embodiment, the amount of a desiccant used in the interior of the package 51 is chosen to absorb the water vapor that permeates through the seals 56 and 58 during the lifetime of the device 51.

Throughout the specification, the sampled (or sample) package 51 means a package which has not been exposed to a humid environment as discussed below. Also, throughout the specification, the fabricated package 51 means a device which encloses a plurality of interferometric modulators (interferometric modulator array). In certain embodiments, before the humidity testing, initial measurements (e.g., weight, color, resistance, initial relative humidity, etc.) can be made, if needed (210).

The sampled package 51 is exposed to an environment, for example, via a humidity chamber 53 that contains sufficient amount of water vapor for this testing for a certain period of time, e.g., 250-500 hours (220). In one embodiment, the humidity chamber 53 may provide a more severe humidity condition than an ordinary environment where people actually live and use electronics. For example, if the ordinary environment is at 40° C. and 90% RH (relative humidity), the humidity chamber 53 can be set, for example, at about 70° C. and 80% RH, or 85° C. and 60%. That is, with the use of the humidity chamber 53 for a short period of time, the sampled package 51 can be simulated as if it has been exposed to humidity much longer than otherwise (e.g., an ambient environment; will be described).

In another embodiment, the sample package 51 can be exposed to an environment (X), other than the humidity chamber 53, where a sufficient amount of humidity exists for this testing or which has a similar temperature humidity level to the humidity chamber 53. In another embodiment, the sample package 51 can be exposed to an ambient environment (an ordinary environment; Y) where people actually live and use electronics. In this environment, the exposure time will be longer than when the sample package 51 is exposed to a more humid environment such as in the humidity chamber 53. Throughout the specification, the term "a humid environment" may represent at least one of the humidity chamber and the environments X and Y as identified above.

After a certain (predetermined) period of time, the package 51 is removed from the humidity chamber 53 or other humid environment (230). In one embodiment, depending on the degree of the humidity, the exposure time can vary. For example, if the sampled package 51 is exposed to a more humid environment such as the humidity chamber 53, the predetermined period of time will relatively shorter than when the sampled package 51 is exposed to a less humid environment such as an ambient environment. For convenience, the package which has been removed from the humid environment will be referred to as an exposed package 60. In various embodiments, the humidity testing can be performed for the exposed package 60. In another embodiment, the humidity testing can be performed for the sample package 51, which has not been exposed to the humid environment. This testing would be still useful if water vapor has not been sufficiently removed from the sample package 51 during the fabrication process. However, for convenience, the humidity testing procedure will be described with respect to the exposed package 60.

In one embodiment, as outlined in FIG. 8, the humidity testing is performed based on, for example, a weight measurement testing (A), a color change of desiccant testing (B), a resistance measurement testing (C), a cold finger measurement testing (D), and the combination of C and D (E). In another embodiment, one or more of the testing processes as indicated above may be combined with each other to provide a number of humidity testing processes. In another embodiment, one or more of the testing processes as indicated above may be modified depending on a situation as exemplified in FIG. 9C (modified version of "A"). In still another embodiment, the combination of one or more of the testing processes as indicated above may be modified depending on a situation as exemplified in FIG. 10D (modified version of the combination of "A" and "B").

In various embodiments, the evaluation of the degree of the determined relative humidity in the inside of the exposed package 60 may be made by considering, for example, at least one of the following parameters: i) temperature-humidity combination (e.g., 40° C. and 90% RH, or 85° C. and 60% RH), ii) the thickness and width of the seal 24, iii) adhesive permeability (e.g., 12.1 gram-nmm/m² per day per KPa), iv) desiccant capacity (e.g., 10% of the desiccant weight), and v) display size (e.g., 1.1 inch diagonal or 4.5 inch diagonal), etc.

Figure 9A:
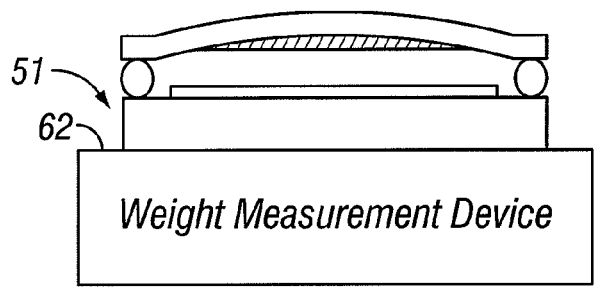
FIGS. 9A and 9B illustrate a humidity testing process according to one embodiment of the invention.
Figure 9B:
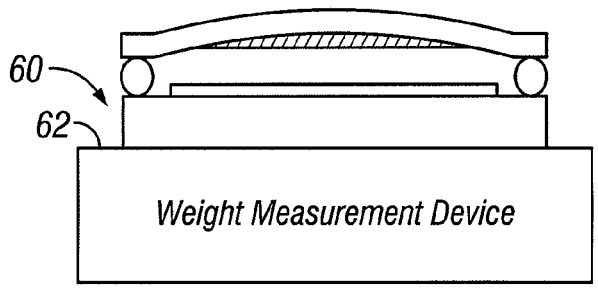

FIGS. 9A and 9B illustrate a humidity testing process according to one embodiment of the invention. In this embodiment, the humidity level of the exposed package 60 is determined by comparing the weights of the sample package 51 and the exposed package 60. In another embodiment, the humidity level in the inside of the exposed package 60 can be determined by comparing the weight of the exposed package 60 and an average weight of a plurality of sample (unexposed) packages.

Referring to FIG. 9A, the weight of the sample package 51 (i.e. before the package is exposed to the humid environment) is measured using a weight measurement device (or scale) 62. In one embodiment, the weight measurement device 62 includes any kind of scale which can identify a weight gain. In one embodiment, the weight scale of the device 62 is accurate to, for example, about ±0.1 mg. In another embodiment, the weight scale of the device 62 is accurate to, for example, about ±0.05 mg. In one embodiment, the weight measurement device 62 includes, for example, AE163 or XS105 available from Mettler.

Referring to FIG. 9B, the weight of the exposed package 60 (i.e. after the package is exposed to the humid environment) is measured using the weight measurement device 62. For example, if the weight of the sample package 51 is Y (g) and the weight of the exposed package 60 is Y+α (g), the weight gain (α) can be used to evaluate the humidity level in the inside of the exposed package 60. In one embodiment, if the weight gain (α) is greater than a threshold value, the exposed package 60 may be determined to be defective or to have a shortened lifetime. For example, for 300 hours of exposure time at 85° C. and 60% relative humidity, the exposed package with about 1 mg weight gain may be determined to be defective in one test scenario.

Figure 9C:
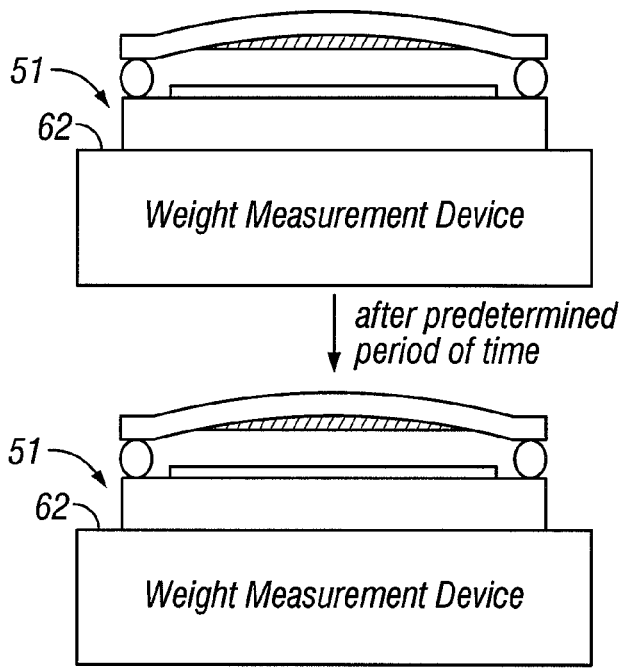
FIG. 9C illustrates a humidity testing process according to one embodiment of the invention.
Figure 10A:
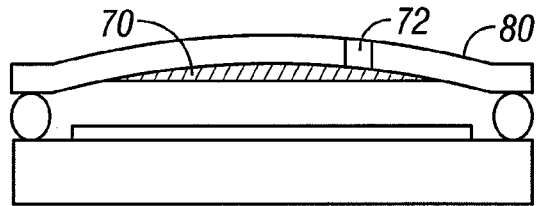
FIGS. 10A-10C illustrate a humidity testing process according to another embodiment of the invention.
Figure 10B:
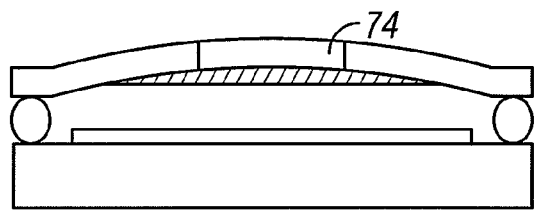
Figure 10C:
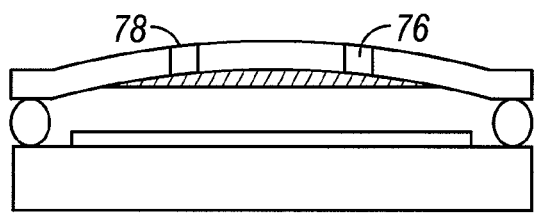

FIG. 9C illustrates a humidity testing process according to another embodiment of the invention. In this embodiment, the same sampled package can be measured at least twice with a predetermined time interval. In this embodiment, a sampled package 51 is measured and a first weight is obtained by the weight measurement device 62. After a predetermined period of time, the sampled package 51 is measured and a second weight is obtained. As discussed above, the predetermined period of time varies depending on humidity level requirement. The measured first and second weights are compared. A relative humidity value or a degree of the relative humidity inside the package is determined based on the weight comparison. In one embodiment, the weight of the sampled package 51 is measured more than twice FIGS. 10A-10C illustrate a humidity testing process according to another embodiment of the invention. In this embodiment, the humidity level of the exposed package 60 is determined by a color change of the desiccant 70 of the exposed package 60. Generally, a desiccant changes its color when it absorbs moisture. Also, generally the color of a desiccant may vary according to the amount of the moisture that the desiccant has absorbed. In one embodiment, a certain desiccant's original color is, for example, blue. In this embodiment, the desiccant 70 may start changing its color from blue to, for example, red as the desiccant absorbs moisture around it, for example, at about 25° C. and 15% RH. Furthermore, the desiccant's color may completely turn into a certain color (e.g., red) from its original color when the desiccant 70 absorbs moisture more than a certain amount, at about 25° C. and 40% RH.

In one embodiment, the backplate 80 is made of a transparent material so that the color change of the desiccant 70 can be seen from the entire transparent backplate 80. In this embodiment, there is no separate window needed to see the desiccant's color or color change. In another embodiment, the backplate 80 is neither transparent nor semi-transparent. In this embodiment, the backplate 80 includes a transparent window 72 as shown in FIG. 10A so that the color change of the desiccant 70 can be seen from the outside of the package 60 via the window 72. In another embodiment, the size of a window 74 may vary as shown in FIG. 10B. In still another embodiment, the backplate 80 includes a plurality of transparent windows 76 and 78 as shown in FIG. 10C.

In one embodiment, before the sample package 51 is exposed to the humid environment, the color of the desiccant 70 can be determined either manually or automatically. In this embodiment, the desiccant's color of the exposed package 60 can be compared with that of the sample package 51 to determine the degree of the color change. After checking the color of the desiccant 70 of the exposed package 60 and/or comparing the desiccant's color change between the sampled package 51 and exposed package 60, the degree of the detected color and/or the color change may be used to evaluate the level of the relative humidity in the inside of the exposed package 60. In one embodiment, the evaluation comprises calculating the lifetime of the package and determining whether the sample package 51 is defective or not.

Figure 10D:
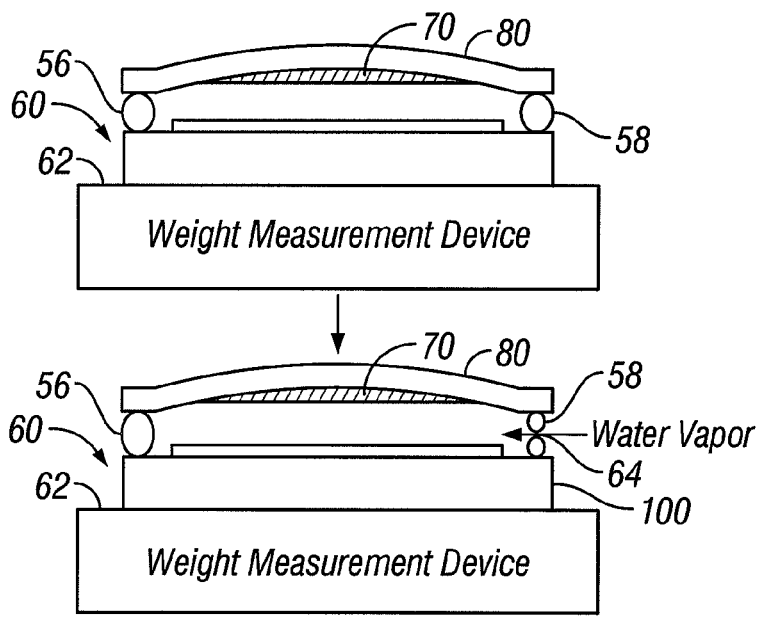
FIG. 10D illustrates a humidity testing process according to another embodiment of the invention.

FIG. 10D illustrates a humidity testing process according to another embodiment of the invention. In this embodiment, the desiccant 70 does not change its color even if it absorbs water vapor. This embodiment is one of destructive humidity testing methods. First, an exposed package 60 or a sampled package 51 (hereinafter the exposed package 60) is measured by the weight measurement device 62. Secondly, an opening 64 is defined on an outside portion of the exposed package 60, for example, on the seal 58 so as to provide water vapor into the package 60. In another embodiment, the opening 64 can be defined on another portion, for example, on the substrate 100, the backplate 80, or the seal 56. In one embodiment, water vapor may be injected into the package 60 to expedite the processing with the use of, for example, a pump (not shown). In another embodiment, water vapor is allowed to permeate into the package 60 without using any device. Next, the exposed package 60 is measured again by the weight measurement device 62.

If the desiccant 70 is working properly, it will absorb a significant amount of permeated water vapor during a short period of time, and the second weight will be even greater than the first weight. In this situation, it can be determined that a relative humidity value or a degree of the relative humidity inside the package 60, before defining the hole 64, was acceptable.

If the desiccant is not working properly, it will not absorb the permeated water vapor any more, and the second weight will be substantially the same as the first weight. In this situation, it can be determined that a relative humidity value or a degree of the relative humidity inside the package 60, before defining the hole 64, was quite high and not acceptable.

Figure 11A:
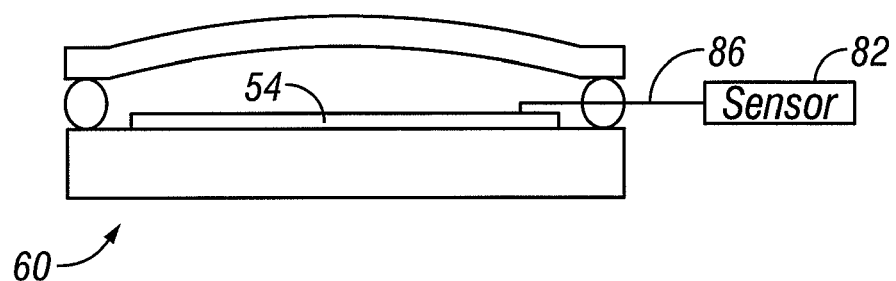
FIGS. 11A and 11B illustrate a humidity testing process according to another embodiment of the invention.
Figure 11B:
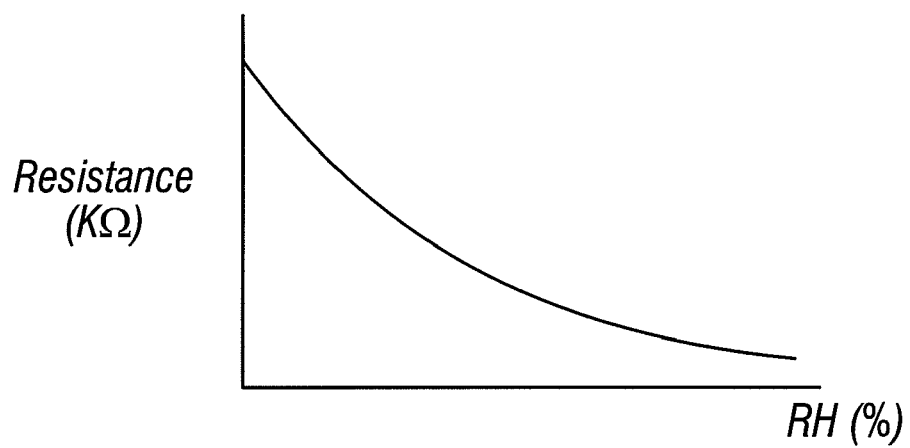

FIGS. 11A and 11B illustrate a humidity testing process according to another embodiment of the invention. In this embodiment, the relative humidity in the interior of the exposed package 60 is measured with the use of a resistive humidity sensor 82. In one embodiment, the sensor 82 is connected to a lead 86 of the package 60. The lead 86 can be connected to an electrode of the interferometric modulator array 54 or a portion of the interferometric modulator array 54, or any interior portion (for example, on the backplate 80 or the substrate 100) of the package 60 where an electrical impedance or resistance can be measured around the portion. In one embodiment, the lead 86 is an existing lead of the package 60. In another embodiment, the lead 86 is a patterned lead formed during the interferometric modulator fabrication process for this humidity testing. In this embodiment, the patterned lead may be located in an unused portion (e.g., a corner area) of the interferometric modulator. The patterned lead can be removed or maintained after the humidity testing is complete. In still another embodiment, the lead 86 is a separate lead which can be inserted into the interior of the package 60 via a hole that is defined for this purpose.

Generally, the resistance of a material and the relative humidity around the material have an exponential relationship as shown in FIG. 11B. In one embodiment, the sensor 82 can provide a relative humidity value by converting the measured resistance value into a corresponding relative humidity value based on the known relationship between resistance and relative humidity, e.g., as shown in FIG. 11B.

Figure 12A:
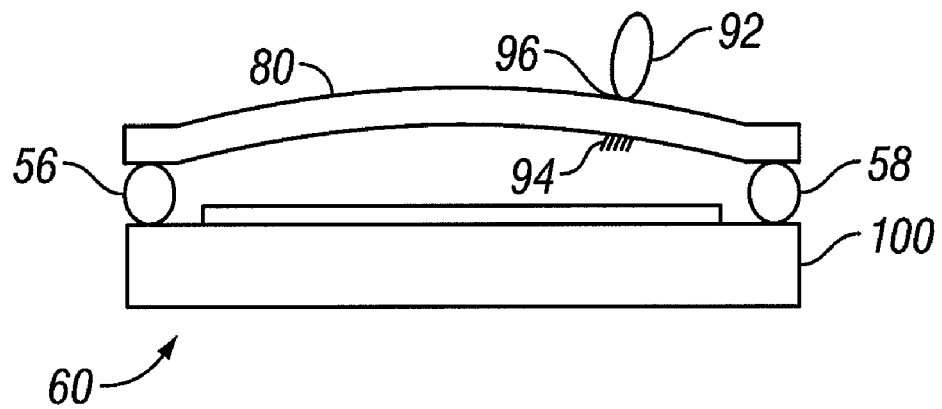
FIGS. 12A-12C illustrate a humidity testing process according to still another embodiment of the invention.
Figure 12B:
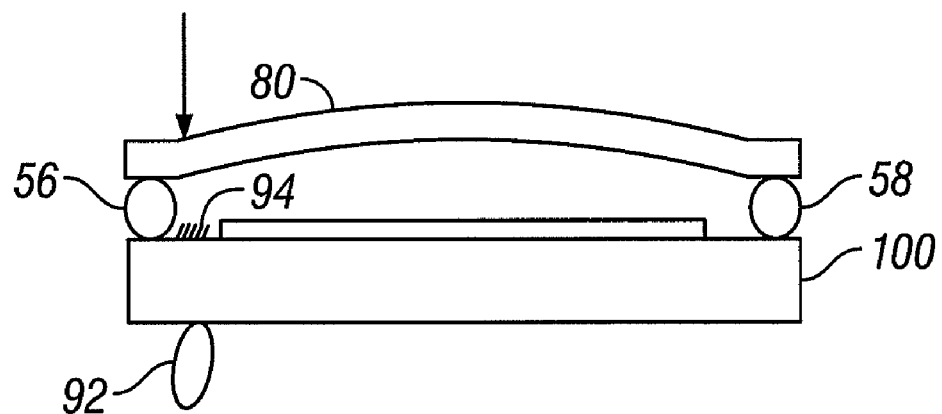
Figure 12C:
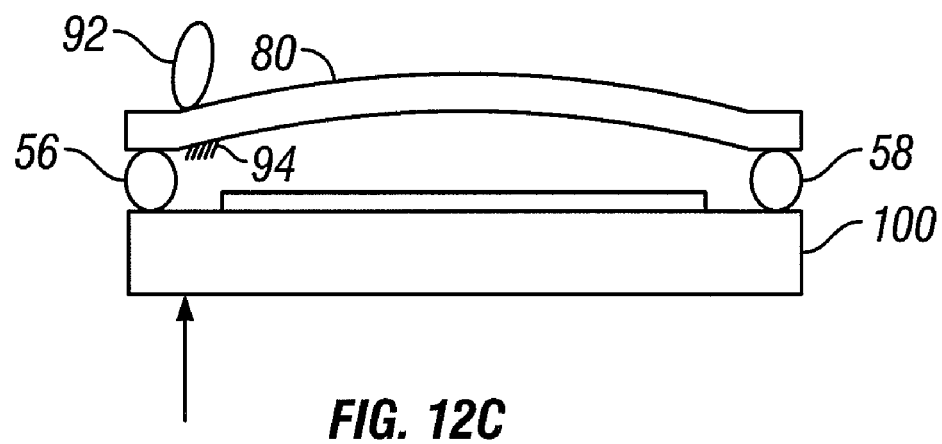

FIGS. 12A-12C illustrate a humidity testing process according to still another embodiment of the invention. In this embodiment, the humidity level of the exposed package 60 is determined with the use of a cold finger device 92. Generally the cold finger device 92 has a hollow portion where refrigerated material (ice, dry ice, etc.) is placed. In one embodiment, the cold finger device 92 is set at a temperature of, for example, −20° C., −40° C., or −60° C. Alternatively, other temperatures lower or higher than, or between the exemplified temperatures can be used depending on the embodiment. In one embodiment, the cold finger device 92 is formed of a thermally conductive material, for example, a metal. In one embodiment, certain liquid material such as alcohol can be applied on the contacting area of the cold finger device 92 to provide better contact and thermal conductance.

In one embodiment, the cold finger device 92 is configured to contact a particular area of the backplate 80 as shown in FIG. 12A. In another embodiment, the cold finger device 92 is configured to contact a particular area of the substrate 100 or the seals 56, 58. In still another embodiment, the cold finger device 92 is configured to contact a border area of each seal 56, 58 and the substrate 100. In this embodiment, frost (will be described below) which has formed in the interior of the package 60 can be seen via the transparent substrate 100.

In one embodiment, the cold finger device 92 is set at a low temperature, e.g., −60° C. and makes contact with, e.g., an area 96, as shown in FIG. 12A. It is then determined whether frost has formed in an inside area 94 which corresponds to the contacting area 96. In one embodiment, whether frost has formed can be visually determined via a transparent window (not shown in FIG. 12A) formed around the contacting area 96 of the backplate 80. In another embodiment, as discussed above, if the cold finger device 92 makes contact with the substrate 100 or the border area of the seal 56, 58 and the substrate 100, the tester can determine via a portion of the transparent substrate 100 whether the frost has formed in the inside area 94. In still another embodiment, a resistive humidity sensor 82, as discussed with regard to FIG. 11 and shown in FIG. 13, can be used to determine whether frost has formed in the inside area 94. The embodiment of FIG. 13 is particularly useful to determine humidity inside the package 60 when the backplate 80 is neither transparent nor includes a transparent portion.

As discussed with respect to FIGS. 11A and 12A, the sensor 82 can be connected to the lead which is connected to any interior portion of the package 60 (for example, the backplate 80 or the substrate 100, etc.) where an electrical impedance or resistance can be measured around the portion. In this embodiment, the cold finger device 92 contacts an outside area 96 (for example, the backplate 80 or the substrate 100) corresponding to the interior portion. This embodiment is particularly advantageous in determining humidity inside the package 60 when at least one of the backplate 80 and the substrate 100 is not transparent or does not include a transparent portion. In one embodiment, if it is determined with the cold finger device 92 set at a temperature of, e.g., −60° C., that no frost has formed in the inside area 94, indicating that the interior of the package 60 is sufficiently dry (i.e., having sufficiently lower humidity) for the intended operation of the interferometric modulator device, no more humidity testing is generally required. In another embodiment, if it is determined with the cold finger device 92 set at a temperature of, e.g., −60° C., that frost has formed in the inside area 94, the humidity testing can be continued using a higher temperature (e.g., −40° C.). In this embodiment, if it is determined that frost has formed in the inside area 94, either another test with a higher temperature (e.g., −30° C.) can be made or no further humidity testing is made according to the embodiment. This test process may be repeated as many times as desired using different temperature values.

In another embodiment, the cold finger device 92 contacts the substrate 100 as shown in FIG. 12B. In this embodiment, frost forms in the area 94 inside the package 60. In this embodiment, it is preferable that the backplate 80 is transparent or includes at least a transparent portion so that the formed frost can be seen via the transparent backplate 80.

In another embodiment, the cold finger device 92 contacts the backplate 80 as shown in FIG. 12C. In this embodiment, frost forms in the area 94 inside the package 60. In this embodiment, it is preferable that the substrate 100 is transparent or includes at least a transparent portion so that the formed frost can be seen via the transparent substrate 100.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. As will be recognized, the present invention may be embodied within a form that does not provide all of the features and benefits set forth herein, as some features may be used or practiced separately from others.

What is claimed is:

1. A method of testing humidity, comprising:
   determining a property of a device which encloses a plurality of interferometric modulators; and
   determining a relative humidity value or a degree of the relative humidity inside the device based at least in part upon the determined property, wherein the determined property comprises at least one of i) the thickness and width of a seal of the device and ii) adhesive permeability of a component of the device.

2. The method of claim 1, further comprising exposing the device to a humid environment before determining the property.

3. The method of claim 2, wherein the humid environment includes a humidity chamber.

4. The method of claim 1, wherein the determined property further comprises at least one of the following: i) temperature-humidity combination inside the device, ii) a desiccant capacity inside the device and iii) a device size.

5. The method of claim 1, wherein only the relative humidity value is determined based upon the determined property.

6. A system for testing humidity, comprising:
   first means for determining a property of a device which encloses a plurality of interferometric modulators; and
   second means for determining a relative humidity value or a degree of the relative humidity inside the device based at least in part upon the determined property, wherein the determined property comprises at least one of i) the thickness and width of a seal of the device and ii) adhesive permeability of a component of the device.

7. The system of claim 6, wherein the determined property further comprises at least one of the following: i) temperature-humidity combination inside the device, ii) a desiccant capacity inside the device and iii) a device size.

8. The system of claim 6, wherein the second means is configured to determine only the relative humidity value based upon the determined property.

9. A method of testing humidity, comprising:
   providing a device which encloses i) a plurality of interferometric modulators and ii) a desiccant, wherein the desiccant is configured to change its color based on an amount of water vapor absorbed therein;
   determining a degree of a color change of the desiccant; and
   determining a relative humidity value inside the device based at least in part upon the determined degree of the color change.

10. The method of claim 9, wherein the device comprises a backplate which includes at least a transparent portion, and wherein determining the degree of the color change is performed via the transparent portion of the backplate.

11. The method of claim 9, wherein the device comprises a transparent backplate, and wherein determining the degree of the color change is performed via the transparent backplate.

12. The method of claim 9, wherein determining the degree of a color change of the desiccant comprises:
    exposing the device to a humid environment;
    determining a first color of the desiccant before exposing the device to a humid environment;
    determining a second color of the desiccant after exposing the device to the humid environment;
    comparing the first and second colors; and
    determining the degree of a color change of the desiccant based on the color comparison.

13. The method of claim 9, wherein the relative humidity value inside the device is determined considering at least one of the following parameters: i) temperature-humidity combination inside the device, ii) the thickness and width of a seal of the device, iii) adhesive permeability of a component of the device, iv) a desiccant capacity inside the device and v) a device size.

14. A method of manufacturing a microelectromechanical systems (MEMS) device, the method comprising:
    providing a substrate;
    forming a plurality of interferometric modulators on the substrate;
    providing a desiccant configured to change its color based on an amount of water vapor absorbed therein;
    providing a backplate; and
    joining the substrate and the backplate so as to form a device which encloses the plurality of interferometric modulators and the desiccant,
    wherein the backplate includes at least one transparent portion through which the color change of the desiccant can be viewed from the outside of the device, and
    wherein a relative humidity value inside the MEMS device is determined based at least in part upon the determined degree of the color change.

15. The method of claim 14, wherein the relative humidity value inside the device is determined considering at least one of the following parameters: i) temperature-humidity combination inside the device, ii) the thickness and width of a seal of the device, iii) adhesive permeability of a component of the device, iv) a desiccant capacity inside the device and v) a device size.

16. A microelectromechanical systems (MEMS) device, comprising:
    a substrate;
    a plurality of interferometric modulators formed on the substrate;
    a desiccant configured to change its color based on an amount of water vapor absorbed therein; and
    a backplate,
    wherein the substrate and backplate are joined to each other so as to form a device which encloses the plurality of interferometric modulators and the desiccant,
    wherein the backplate includes at least one transparent portion through which the color change of the desiccant can be viewed from the outside of the device, and wherein a relative humidity value inside the MEMS device is determined based at least in part upon the determined degree of the color change.

17. The device of claim 16, wherein the backplate is formed of a transparent material.

18. The device of claim 16, wherein the relative humidity value inside the device is determined considering at least one of the following parameters: i) temperature-humidity combination inside the device, ii) the thickness and width of a seal of the device, iii) adhesive permeability of a component of the device, iv) a desiccant capacity inside the device and v) a device size.

* * * * *

UNITED STATES PATENT AND TRADEMARK OFFICE
CERTIFICATE OF CORRECTION

PATENT NO. : 7,623,752 B2  
APPLICATION NO. : 12/021196  
DATED : November 24, 2009  
INVENTOR(S) : Brian J. Gally et al.

It is certified that error appears in the above-identified patent and that said Letters Patent is hereby corrected as shown below:

At Page 2, Column 1, Line 8, change "3,956,880" to --3,956,923--.

At Page 2, Column 2, Line 65, change "Rhoades" to --Rhoads--.

At Page 2, Column 2, Line 68, change "Kaeiyama" to --Kaeriyama--.

At Page 3, Column 1, Line 54, change "Jr." to --Jr. deceased--.

At page 3, Column 2, Line 67, change "Pichl" to --Piehl--.

At Page 4, Column 1, Line 64, change "Goosen" to --Goossen--.

At Page 4, Column 1, Line 67, change "Goosen" to --Goossen--.

At Page 4, Column 2, Line 6, change "Nanomater-" to --"Nanometer- --.

At Page 4, Column 2, Line 21, change "-Perfomorance" to -- -Performance--.

At Page 4, Column 2, Line 31-32, change "Hilton-Head," to --Hilton Head,--.

At Page 4, Column 2, Line 36, change "etrieved" to --retrieved--.

At Page 4, Column 2, Line 41, change "www.sensormag.com" to --www.sensorsmag.com--.

At Page 4, Column 2, Line 66, change "A" to --"A--.

At Page 4, Column 2, Line 68, change "Micropackages" to --Micropackages"--.

At Page 5, Column 1, Line 4, change "Moisture" to --"Moisture--.

At Page 5, Column 1, Line 5, change "MEMS," to --MEMS",--.

Signed and Sealed this

Ninth Day of November, 2010

David J. Kappos
*Director of the United States Patent and Trademark Office*

CERTIFICATE OF CORRECTION (continued)
U.S. Pat. No. 7,623,752 B2

At Page 5, Column 2, Line 17, change "Optics" to --Optics,--.

At Page 5, Column 2, Line 29, after "for" delete "fpr".

At Page 8, Line 1, change "respectively" to --respectively.--.

At Page 13, Line 48, change "gram-nmm/m$^2$" to --gram-mm/m$^2$--.

At Page 14, Line 30, change "twice" to --twice.--.